US012610810B2

(12) United States Patent
Liu et al.

(10) Patent No.: US 12,610,810 B2
(45) Date of Patent: Apr. 21, 2026

(54) SEMICONDUCTOR STRUCTURE AND METHOD OF MANUFACTURING THE SAME

(71) Applicant: TAIWAN SEMICONDUCTOR MANUFACTURING COMPANY LTD., Hsinchu (TW)

(72) Inventors: Kuan-Liang Liu, Pingtung County (TW); Chung-Liang Cheng, Changhua County (TW); Yen Liang Wu, Tainan City (TW); Chung-Yuan Li, Taichung City (TW); Ya Chun Teng, Tainan City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 752 days.

(21) Appl. No.: 17/810,601

(22) Filed: Jul. 3, 2022

(65) Prior Publication Data

US 2024/0006311 A1     Jan. 4, 2024

(51) Int. Cl.
*H01L 23/528*     (2006.01)
*H01L 23/522*     (2006.01)
(Continued)

(52) U.S. Cl.
CPC ...... *H01L 23/5283* (2013.01); *H01L 23/5226* (2013.01); *H10D 30/031* (2025.01); *H10D 30/6713* (2025.01); *H10D 30/6735* (2025.01); *H10D 30/6755* (2025.01); *H10D 62/115* (2025.01); *H10D 84/0149* (2025.01); *H10D 84/0151* (2025.01); *H10D 84/038* (2025.01)

(58) Field of Classification Search
CPC ............ H01L 23/5283; H01L 23/5226; H01L 23/481; H01L 25/0657; H01L 25/50; H01L 2224/80895; H01L 2224/80896; H01L 21/76898; H10D 30/031; H10D 30/6713; H10D 30/6735; H10D 30/6755; H10D 62/115; H10D 84/0149; H10D 84/0151; H10D 84/038
See application file for complete search history.

(56) References Cited

U.S. PATENT DOCUMENTS 10,340,247 B2 * 7/2019 Lin .................... H01L 21/76898
10,354,987 B1 * 7/2019 Mushiga ................. H01L 24/80
(Continued)

*Primary Examiner* — Dao H Nguyen
(74) *Attorney, Agent, or Firm* — WPAT LAW; Anthony King

(57) ABSTRACT

A semiconductor structure is provided. The semiconductor structure includes a first substrate and a second substrate. The first substrate includes a first semiconductor layer, including a first trench isolation that extends through a portion of the first substrate layer; and a first interconnect structure, disposed over the first semiconductor layer. The second substrate includes a second semiconductor layer, including a plurality of semiconductor islands and surrounded by at least a second isolation penetrating the second semiconductor layer; a second interconnect structure, disposed over the second substrate layer and bonded to the first interconnect structure; and a dielectric layer, disposed over the second semiconductor layer opposite to the second interconnect structure. A method of manufacturing the semiconductor structure is also provided.

20 Claims, 19 Drawing Sheets

100

(51) Int. Cl.
    *H10D 30/01*          (2025.01)
    *H10D 30/67*          (2025.01)
    *H10D 62/10*          (2025.01)
    *H10D 84/01*          (2025.01)
    *H10D 84/03*          (2025.01)

(56)            References Cited

U.S. PATENT DOCUMENTS

| | | | |
|---|---|---|---|
| 10,804,202 B2 * | 10/2020 | Nishida | H01L 21/7624 |
| 12,315,843 B2 * | 5/2025 | Wu | H01L 24/80 |
| 2016/0099182 A1 * | 4/2016 | Lee | H10D 84/0191 |
| | | | 438/109 |
| 2018/0025970 A1 * | 1/2018 | Kao | H10D 84/038 |
| | | | 257/401 |
| 2020/0058617 A1 * | 2/2020 | Wu | H01L 24/83 |
| 2020/0135617 A1 * | 4/2020 | Shen | H01L 23/53228 |
| 2020/0266146 A1 * | 8/2020 | Nishida | H01L 24/73 |
| 2020/0286875 A1 * | 9/2020 | Nishida | H01L 21/76802 |
| 2020/0328244 A1 * | 10/2020 | Umebayashi | H10F 39/8063 |
| 2021/0013088 A1 * | 1/2021 | Chen | H01L 24/94 |
| 2021/0028135 A1 * | 1/2021 | Said | H01L 24/89 |
| 2022/0028915 A1 * | 1/2022 | Jang | H10K 39/32 |
| 2022/0328441 A1 * | 10/2022 | Chen | H10B 43/27 |

* cited by examiner

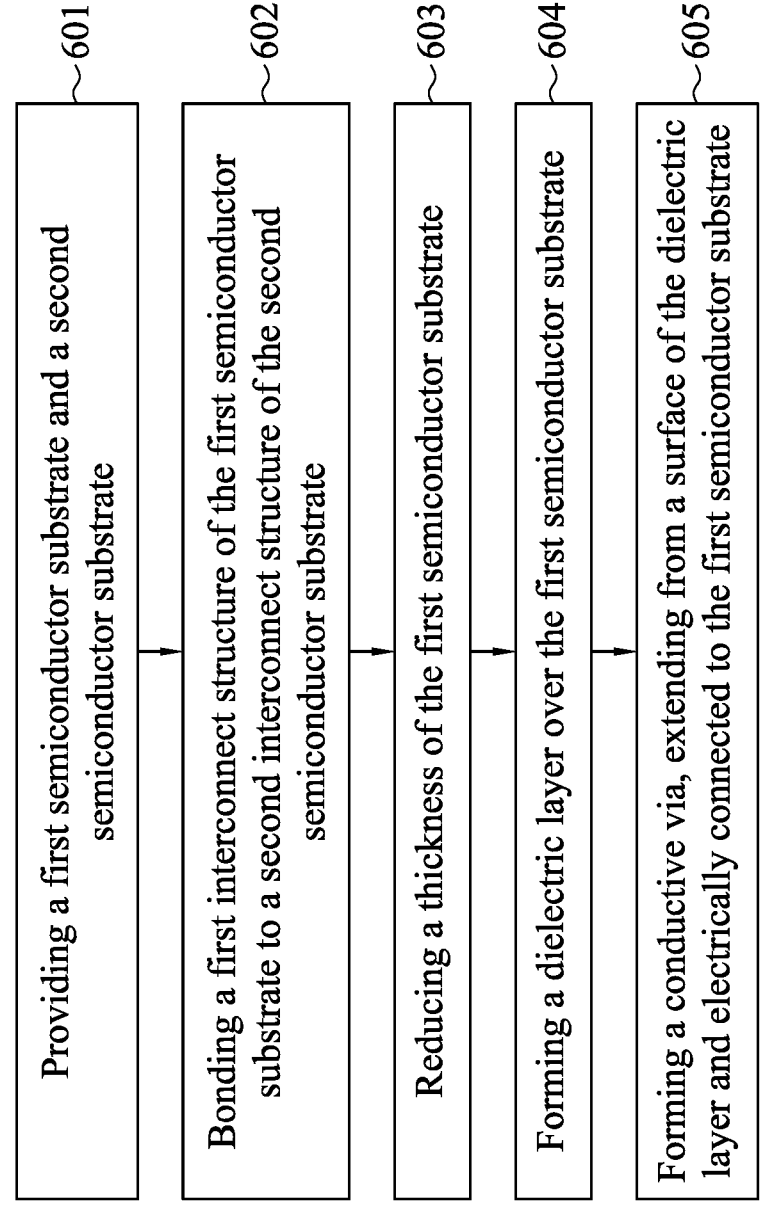

600

601 — Providing a first semiconductor substrate and a second semiconductor substrate 602 — Bonding a first interconnect structure of the first semiconductor substrate to a second interconnect structure of the second semiconductor substrate 603 — Reducing a thickness of the first semiconductor substrate 604 — Forming a dielectric layer over the first semiconductor substrate 605 — Forming a conductive via, extending from a surface of the dielectric layer and electrically connected to the first semiconductor substrate

SEMICONDUCTOR STRUCTURE AND METHOD OF MANUFACTURING THE SAME

BACKGROUND

Use of high frequencies, in millimeter-wave and sub-millimeter-wave frequency bands, is receiving more and more attention. There are significant benefits to using the millimeter or sub-millimeter wave frequencies, since larger frequency bandwidths are available in these frequency ranges. Demands on product performances and a product size are increasing, and manufacturing process and integration of different devices needs to be further improved.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, dimensions of the various features may be arbitrarily increased or reduced for clarity of discussion.

FIG. 2 is a flow diagram of a method of manufacturing a semiconductor structure in accordance with some embodiments of the disclosure.

DETAILED DESCRIPTION

Figure 1:
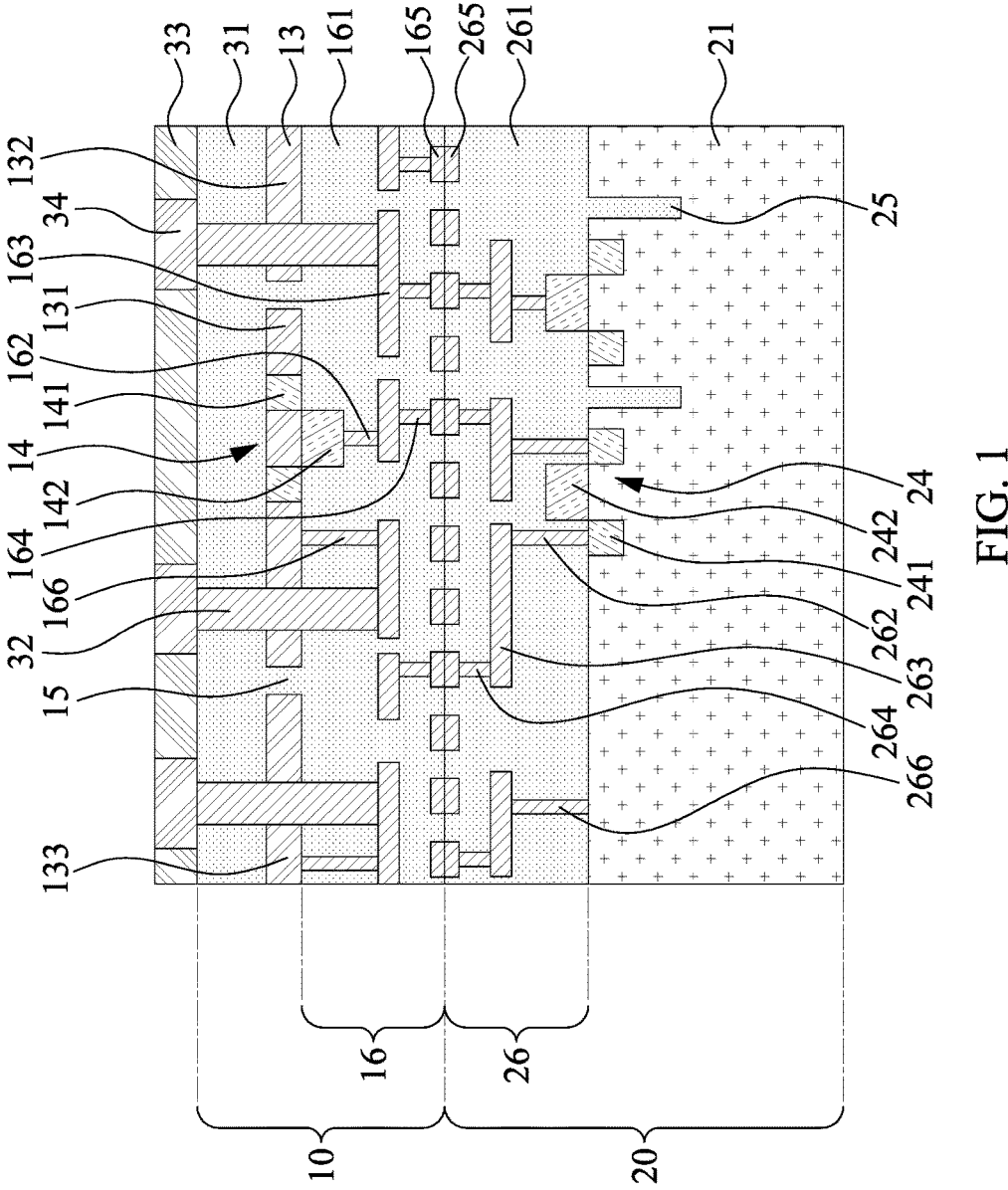
FIG. 1 is a schematic cross-sectional diagram of a semiconductor structure in accordance with some embodiments of the disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context. In addition, the term "source/drain region" or "source/drain regions" may refer to a source or a drain, individually or collectively dependent upon the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages, such as those for quantities of materials, durations of times, temperatures, operating conditions, ratios of amounts, and the likes thereof disclosed herein, should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a schematic cross-sectional diagram of a semiconductor structure 100 in accordance with some embodiments of the present disclosure. The semiconductor structure 100 can include multiple wafers or substrates bonded together, and the wafers or substrates may include devices with different functions. In some embodiments, the semiconductor structure 100 includes a substrate 10 and a substrate 20 bonded to the substrate 10 in a vertical direction. Each of the substrates 10 and 20 may include a semiconductor layer and an interconnect structure.

The substrate 10 includes a semiconductor layer 13. In some embodiments, the semiconductor layer 13 includes semiconductive material, such as silicon. In some embodiments, the semiconductor layer 13 includes other semiconductor materials, such as silicon germanium, silicon carbide, gallium arsenide, or the like. The semiconductor layer 13 may be of a first conductivity type, e.g., a P-type semiconductive substrate (acceptor type), or a second conductivity type, e.g., an N-type semiconductive substrate (donor type). Alternatively, the semiconductor layer 13 may include another elementary semiconductor, such as germanium; a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or combinations thereof. In some embodiments, the semiconductor layer 13 includes a doped epitaxial layer, a gradient semiconductor layer, a semiconductor layer overlaying another semiconductor layer of a different type, such as a silicon layer on a silicon germanium layer, or a combination thereof. In some embodiments, a thickness of the semiconductor layer 13 is in a range of 100 to 5000 angstroms (Å).

A plurality of electrical components 14 may be formed or disposed in the semiconductor layer 13. The electrical components 14 can include active components and/or devices, and may include different types or generations of devices. The electrical components 14 can include a transistor (such as a planar transistor, a multi-gate transistor, a gate-all-around field-effect transistor (GAAFET), a fin field-effect transistor (FinFET), a vertical transistor, a nanosheet transistor or a nanowire transistor), a passive device, a capacitor, or a combination thereof. The electrical components 14 can function as a radio-frequency (RF) device, a power device or an image sensor. For a purpose of simplicity, a planar transistor is depicted in FIG. 1 as an exemplary embodiment of the plurality of electrical components 14, and the electrical component 14 may be referred to as a transistor 14 in the following description. However, such depiction and description are not intended to limit the present disclosure.

In some embodiments, the transistor 14 includes source/drain (S/D) regions 141 and a gate structure 142. In some embodiments, the S/D region 141 extends between two opposite surfaces of the semiconductor layer 13. In some embodiments, a depth of each of the S/D regions 141 is substantially equal to a thickness of the semiconductor layer 13. The gate structure 142 is disposed between the S/D regions over or in the semiconductor layer 13 depending on different applications and different types of transistors. For a purpose of illustration of general purposes or function, the element 14 may be referred to as the electrical component 14, while more detailed descriptions of connections or structure (e.g., the S/D regions 141 and the gate structure 142) of the element 14 may refer to such element as the transistor 14. Such terms are not intended to limit the disclosure.

The semiconductor layer 13 may further include one or more isolations 15. In some embodiments, each of the isolations 15 is a through isolation penetrating the semiconductor layer 13. In some embodiments, the isolations 15 are connected and the semiconductor layer 13 is divided into multiple semiconductor islands, such as semiconductor islands 131, 132 and 133 shown in FIG. 1. In other words, each of the semiconductor islands (e.g., 131, 132 and 133) is surrounded by the isolations 15. In some embodiments, the semiconductor islands 131, 132 and 133 are electrically isolated from one another by the isolations 15. In some embodiments, each of the semiconductor islands 131, 132 and 133 includes at least one transistor 14. For a purpose of illustration and simplicity of drawings, in FIG. 1, only the semiconductor island 131 is depicted as having a transistor 14. However, such depiction is not intended to limit the present disclosure.

An interconnect structure 16 may be formed or disposed over the semiconductor layer 13. In some embodiments, the interconnect structure 16 includes a dielectric layer 161, a plurality of conductive lines, such as conductive lines 163 and 165, and a plurality of conductive vias, such as conductive vias 162, 164 and 166, alternately arranged between or among the conductive lines 163 and 165. The interconnect structure 160 may further include a plurality of bonding pads 165 electrically connected to the conductive lines 163 by the conductive vias 164. In some embodiments, the dielectric layer 161 is a multi-layer structure. In some embodiments, the gate structure 142 of the transistor 14 is covered by one or more sub-layers of the dielectric layer 161. In some embodiments, a material of the dielectric layer 161 is same as that of the isolations 15, and an interface between the dielectric layer 161 and the isolations 15 may not be observed. In some embodiments, the conductive lines 163 are electrically isolated or physically separated from each other by the dielectric layer 161. The conductive lines 163 can be arranged into multiple layers stacked in the vertical direction, wherein each of the layers of the conductive lines 163 is separated by a sub-layer of the dielectric layer 161. For a purpose of simplicity, only one layer of conductive lines 163 is depicted in FIG. 1 as an exemplary illustration of the multiple layers of the conductive lines 163, but such depiction is not intended to limit the present disclosure. In some embodiments, the conductive lines 165 are similar to the conductive lines 163. In some embodiments, the conductive lines 165 represent the conductive lines of the interconnect structure 16 that are bonded to the substrate 20.

The conductive vias 164 represent those of the conductive vias of the interconnect structure 16 that are disposed between and electrically connecting adjacent layers of the conductive lines 163, wherein the conductive vias 164 are disposed between the conductive lines 165 and an adjacent layer of the conductive lines 163. In some embodiments, the conductive vias 164 are electrically isolated or physically separated from each other by the dielectric layer 161. The conductive vias 162 represent the conductive vias of the interconnect structure 16 that are disposed between and electrically connect the transistors 14 and the conductive lines 163. It should be noted that, for exemplary illustration, only one conductive via 162 disposed between the gate structure 142 and one of the conductive lines 163 is shown in FIG. 1. In some embodiments, the interconnect structure 16 includes multiple conductive vias 162 disposed between and electrically connecting the gate structure 142 and the conductive lines 163. The conductive vias 166 represent the conductive vias 166 of the interconnect structure 16 that are disposed between and electrically connect the semiconductor layer 13 and the conductive lines 163. In some embodiments, the conductive vias 166 are for a purpose of electrical connection for controlling a voltage of the semiconductor layer 13. Therefore, a conductive line 163 electrically connected to the conductive via 166 is electrically isolated or physically separated from the conductive vias 164 and other conductive lines 163. In some embodiments, the conductive vias 166 are electrically connected to the conductive lines 163 in a same layer. In some embodiments, the conductive vias 166 are electrically connected to the conductive lines 163 in the first layer of the conductive lines 163 over the semiconductor layer 13. In addition, each of the semiconductor islands can electrically connect to one or more conductive vias 166 depending on different applications.

The substrate 20 may include a semiconductor layer 21 and an interconnect structure 26 disposed over the semiconductor layer 21. Arrangements of the semiconductor layer 21 and the interconnect structure 26 can be similar to those of the semiconductor layer 13 and the interconnect structure 16. For a purpose of brevity, only differences between the semiconductor layer 21 and the semiconductor layer 13, and between the interconnect structure 26 and the interconnect structure 16, are emphasized in the following specification, and descriptions of similar or same conditions, arrangements, functions and properties are omitted.

A thickness of the semiconductor layer 21 is greater than the thickness of the semiconductor layer 13. In some embodiments, the semiconductor layer 21 includes one or more electrical components 24 and one or more isolations 25 disposed between some of the electrical components 24. The isolations 25 may extend through only a portion of the semiconductor layer 21 without penetrating through the semiconductor layer 21 due to the thickness of the semiconductor layer 21 being greater than the thickness of the semiconductor layer 13. In other words, a portion of the semiconductor layer 21 disposed below the isolations 25 extends continuously in a horizontal direction substantially perpendicular to the vertical direction. In some embodiments, the thickness of the semiconductor layer 21 is substantially greater than 1 micron ($\mu$m). In some embodiments, the portion of the semiconductor layer 21 below the isolations 25 is a monolithic structure. The electrical components 24 can be similar to the electrical components 14, and thus, the electrical components 24 can be referred to as the transistors 24. Each of the transistors 24 includes S/D regions 241 and a gate structure 242 disposed between the S/D regions 241. In some embodiments, the S/D regions 241 of the transistor 24 are disposed in and extend through only a portion of the semiconductor layer 21. In some embodiments, the S/D regions 241 extend from a surface facing the interconnect structure 26 toward an opposite surface. In some embodiments, a depth of each of the S/D regions 241 is less than a depth of the isolation 25. The depth of the isolation 25 and the depth of the S/D regions 241 are substantially less than the thickness of the semiconductor layer 21. In some embodiments, the gate structure 242 is disposed over the semiconductor layer 21 and covered by a dielectric layer 261 of the interconnect structure 26. The electrical components (or transistors) 24 may have functions different from those of the electrical components (or transistors) 14. In some embodiments, the electrical component 24 can function as a logic device.

The interconnect structure 26 can be similar to the interconnect structure 16 but without the conductive vias 166. Descriptions of the dielectric layer 261, conductive vias 262, 264 and 266, and conductive lines 263 and 265 can be found by referring to the dielectric layer 161, the conductive vias 162, 164 and 166, and the conductive lines 163 and 165, and repeated description is omitted herein. Since the semiconductor layer 21 is a continuous structure and is not separated by the isolations 25, the interconnect structure 26 may include one conductive via 266 electrically connected to the semiconductor layer 21 as shown in FIG. 1. However, the present disclosure is not limited thereto. In some embodiments, multiple conductive vias 266 are provided to electrically connect to the semiconductor layer 21. In some embodiments, the interconnect structure 26 does not include the conductive via 266, and a voltage of the semiconductor layer 21 is controlled by an electrical path. In addition, one or more transistors 14 may electrically connect to one or more transistors 24 through the interconnect structures 16 and 26. For example, the gate structure 142 of the transistor 14 is electrically connected to the S/D region 241 of the transistor 24 so as to control operation of the transistor 14 according to an output signal of the transistor 24.

The conductive lines 265 of the interconnect structure 26 are bonded to the conductive lines 165 of the interconnect structure 16 of the substrate 10. An interface between the interconnect structures 16 and 26 defines a bonding interface. An interface between the dielectric layers 161 and 261 defines a portion of the bonding interface, and may or may not be observed by an electron microscope.

The substrate 10 may include a dielectric layer 31, and the semiconductor structure 100 may include a passivation layer 33 disposed over the substrate 10 opposite to the substrate 20. In some embodiments, the dielectric layer 31 is disposed between the passivation layer 33 and the semiconductor layer 13. The semiconductor structure 100 may further include a plurality of conductive vias 32 and a plurality of conductive pads 34 electrically connected to the plurality of conductive vias 32. In some embodiments, the conductive pads 34 are disposed over the dielectric layer 31 and surrounded by the passivation layer 33. In some embodiments, the conductive vias 32 penetrate the dielectric layer 31. In some embodiments, the conductive vias 32 further penetrate the semiconductor layer 13 and a portion of the dielectric layer 161 (e.g., one or more sub-layers of the dielectric layer 161). The conductive vias 32 and the conductive pads 34 collectively provide electrical connections to the transistors 14, the transistors 24, the semiconductor layer 13 and the semiconductor layer 21.

For example, one of the conductive vias 32 is electrically connected to one of the semiconductor islands 131, 132 or 133 for a purpose of controlling a voltage of the semiconductor island 131, 132 or 133 of the semiconductor layer 13. In some embodiments, the conductive via 32 is electrically connected to the semiconductor island 131, 132 or 133 through the interconnect structure 16. More specifically, the conductive via 32 penetrates the dielectric layer 31 and the semiconductor layer 13 and is electrically connected to one of the conductive vias 166 through a corresponding one of the conductive lines 163. In alternative embodiments, the conductive via 32 extends from the conductive pad 34 and extends to the semiconductor island 131, 132 or 133. For another example, the conductive via 32 is electrically connected to the transistor 14 through the interconnect structure 16 for a purpose of controlling an operation of the transistor 14. In some embodiments, the conductive via 32 penetrates the dielectric layer 31 and the semiconductor layer 13 and extends only to a conductive line 163. As one more example, one of the conductive vias 32 is electrically connected to the transistor 24 for a purpose of controlling an operation of the transistor 24. In some embodiments, the conductive via 32 penetrates the dielectric layer 31 and the semiconductor layer 13 and extends only to the conductive line 163. The conductive via 32 can be electrically connected to the transistor 24 through the interconnect structures 16 and 26.

With the development and progress of 5G communication, integration of logic devices and RF devices has become an important issue. It is common that the logic devices are formed over a bulk substrate and the RF devices are formed over a semiconductor-on-insulator (SOI) substrate due to electrical properties of the logic devices and the RF devices. Conventionally, different devices (for example, wafers or chips) are horizontally arranged and packed into a package structure, and the devices are electrically connected through wiring. It is difficult to reduce a size of the package structure. In addition, it is difficult to integrate manufacturing of the RF devices and the logic devices into a single substrate due to their electrical properties and different temperature tolerances of materials. The present disclosure provides a semiconductor structure that includes two bonded substrates (or wafers) having different functions, wherein one of the substrates can be an SOI substrate. For instance, the semiconductor structure of the present disclosure can include a logic device (e.g., in the substrate 20) and an RF device (e.g., in the substrate 10) vertically stacked over the logic device. A product size can be reduced by about 30% to about 50% compared to the conventional structure, and problems incurred in the conventional process during integration of the two devices onto a single wafer can be avoided.

A method of manufacturing a semiconductor structure similar to the semiconductor structure 100 is also provided in the disclosure. In order to further illustrate concepts of the present disclosure, various embodiments are provided below. For a purpose of clarity and simplicity, reference numbers of elements with same or similar functions are repeated in different embodiments. However, such usage is not intended to limit the present disclosure to specific embodiments or specific elements. In addition, conditions or parameters illustrated in different embodiments can be combined or modified to have different combinations of embodiments as long as the parameters or conditions used are not conflicted.

FIG. 2 is a flow diagram of a method 600 for manufacturing a semiconductor structure in accordance with some embodiments of the present disclosure. The method 600 includes a number of operations (601, 602, 603, 604 and 605) and the description and illustration are not deemed as a limitation to the sequence of the operations. A first substrate and a second substrate are provided or received in the operation 601. A first interconnect structure of the first substrate is bonded to a second interconnect structure of the second substrate in the operation 602. A thickness of the first substrate is reduced in the operation 603. A dielectric layer is formed over the first semiconductor layer in the operation 604. A conductive via extending from a surface of the dielectric layer and electrically connected to the first semiconductor layer is formed in the operation 605. It should be noted that the operations of the method 600 may be rearranged or otherwise modified within the scope of the various aspects. Additional processes may be provided before, during, and after the method 600, and some other processes may be only briefly described herein. Thus, other implementations are possible within the scope of the various aspects described herein.

FIGS. 3 to 19 are schematic cross-sectional diagrams of a semiconductor structure at different stages of the method 600 in accordance with some embodiments of the present disclosure. Referring to FIGS. 3 to 6, in the operation 601, a substrate 10 shown in FIG. 6 is formed, provided or received. The substrate 10 can be formed by a sequence of processes.

Figure 3:
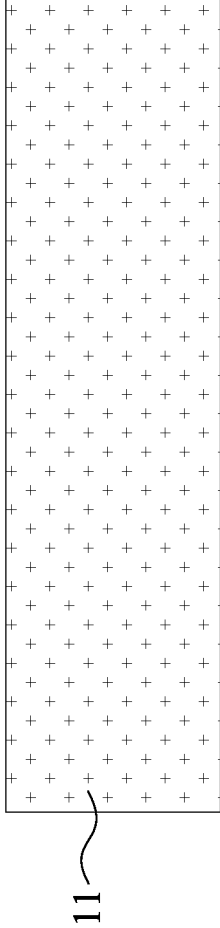
FIGS. 3 to 16 are schematic cross-sectional diagrams of a semiconductor structure at different stages of a manufacturing method in accordance with some embodiments of the disclosure.

Please refer to FIG. 3, which is a schematic cross-sectional diagram of a semiconductor structure at a stage of the operation 601 of the method 600 in accordance with some embodiments of the present disclosure. A semiconductor layer 11 is received or provided. In some embodiments, the semiconductor layer 11 includes a bulk semiconductor material, such as silicon (single crystalline silicon or polycrystalline silicon). In some embodiments, the semiconductor layer 11 is a raw wafer. In some embodiments, a thickness of the semiconductor layer 11 is in a range of 500 to 1000 microns (μm).

Figure 4:
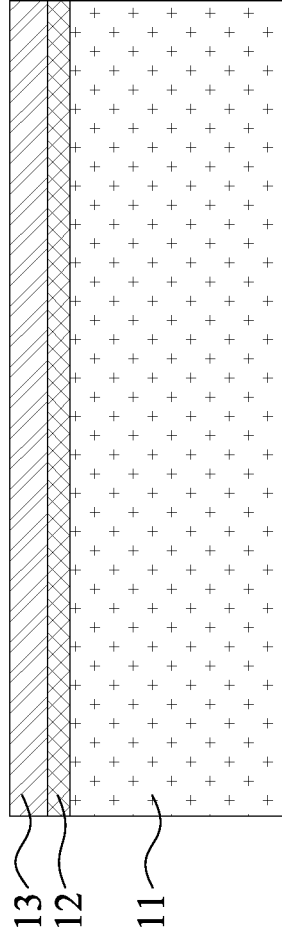

Please refer to FIG. 4, which is a schematic cross-sectional diagram of a semiconductor structure at a stage of the operation 601 of the method 600 in accordance with some embodiments of the present disclosure. An etch stop layer 12 and a semiconductor layer 13 are formed in sequence. In some embodiments, the etch stop layer 12 is formed, grown, or deposited over a top surface of the semiconductor layer 11. In some embodiments, the etch stop layer 12 includes silicon germanium. In some embodiments, the etch stop layer 12 is formed by epitaxial growth. In some embodiments, a thickness of the etch stop layer 12 is in a range of 5 to 20 nm. In some embodiments, the thickness of the etch stop layer 12 is in a range of 8 to 12 nm. In some embodiments, the semiconductor layer 13 is formed after the formation of the etch stop layer 12. The semiconductor layer 13 may be formed by a deposition or by epitaxial growth. The semiconductor layer 13 may include materials as described above. In some embodiments, the semiconductor layer 13 includes single crystalline silicon. In some embodiments, the semiconductor layer 13 includes polycrystalline silicon. In some embodiments, the semiconductor layer 13 includes polycrystalline silicon alloy. In alternative embodiments, the etch stop layer 12 is formed by a doping operation, and the semiconductor layer 13 is a surficial portion of the semiconductor layer 11 over the etch stop layer 12. In some embodiments, a dopant of the doping operation includes arsenic (As). Other suitable dopants can be applied, and are not limited herein. In some embodiments, a thickness of the semiconductor layer 13 is in a range of 100 to 5000 angstroms (Å).

Figure 5:
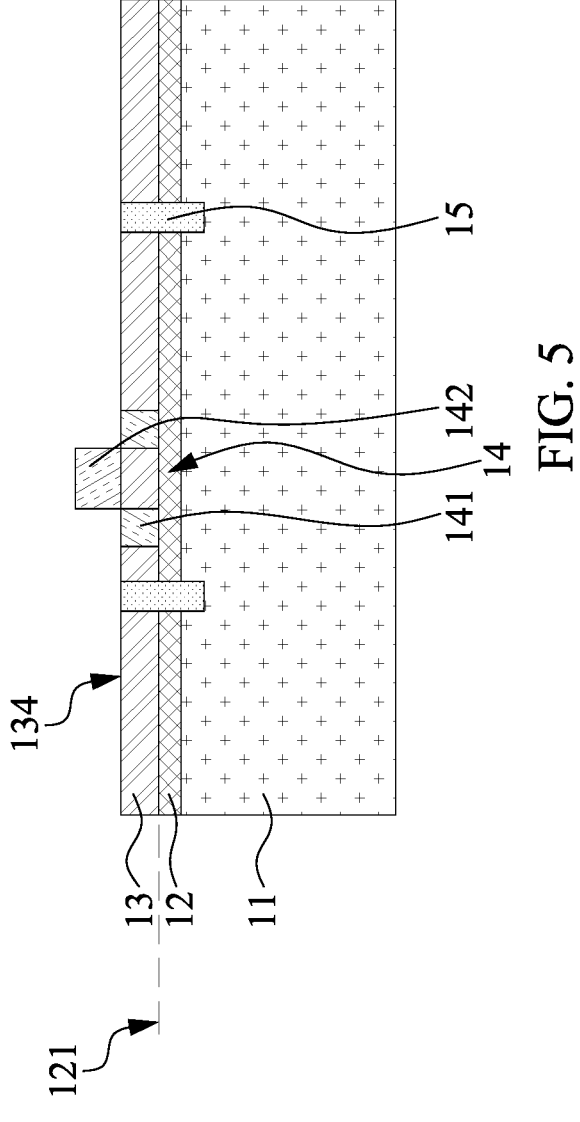
Figure 6:
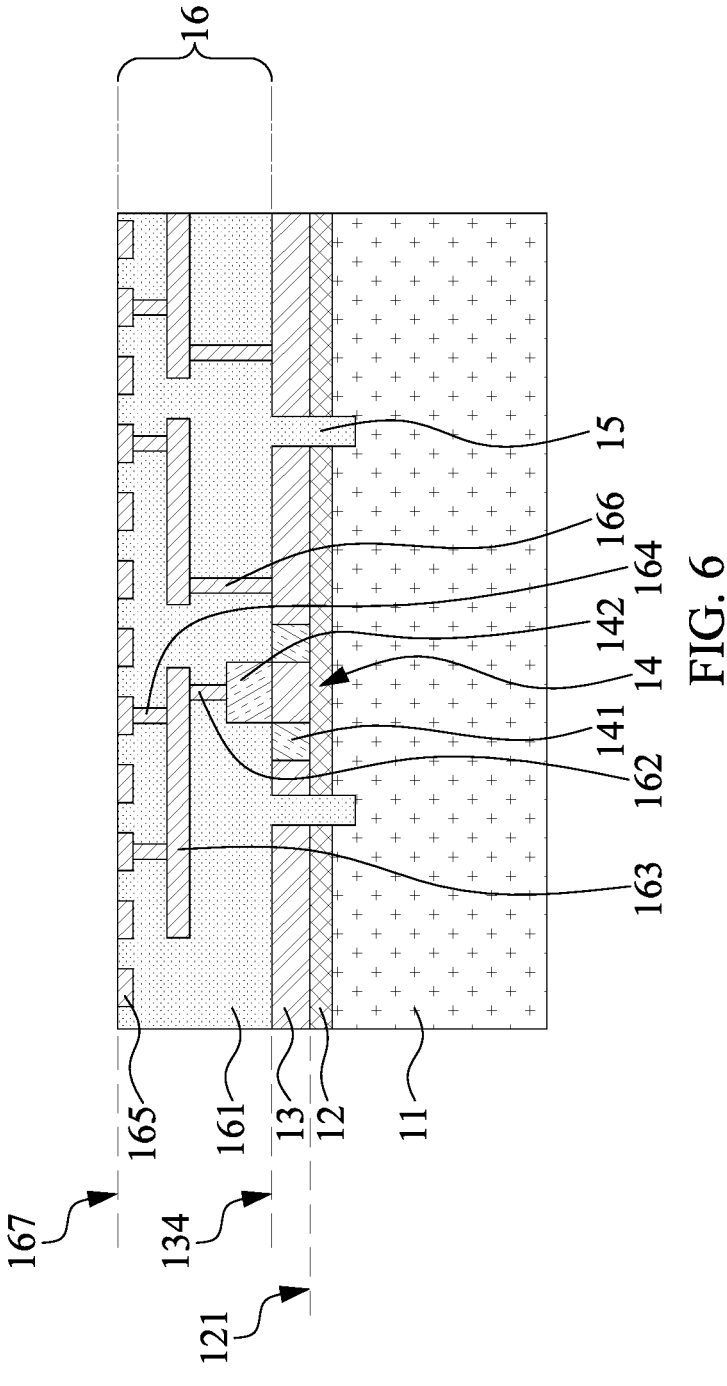

Please refer to FIG. 5, which is a schematic cross-sectional diagram of a semiconductor structure at a stage of the operation 601 of the method 600 in accordance with some embodiments of the present disclosure. One or more electrical components 14 are formed in the semiconductor layer 13 over the etch stop layer 12. In some embodiments, the electrical component 14 includes at least one transistor. For a purpose of illustration, a transistor is depicted in the drawings to represent the electrical component 14, and the electrical component 14 may be referred to as the transistor 14 in the following description. However, such description is not intended to limit the present disclosure. The transistor 14 can be formed by a conventional manufacturing process, and details of the manufacturing process are omitted herein. In some embodiments, the transistor 14 is formed entirely over the etch stop layer 12. In some embodiments, S/D regions 141 of the transistor 14 extend between a top surface 134 of the semiconductor layer 13 and a top surface 121 of the etch stop layer 12. In some embodiments, the S/D regions 141 are doping regions, and dopants of the S/D regions 141 extend only to the top surface 121 of the etch stop layer 12.

One or more isolations 15 may also be formed in the semiconductor layer 13. The isolations 15 extend from the top surface 134 of the semiconductor layer 13 toward the semiconductor layer 11. In some embodiments, the isolations 15 are trench isolations. A depth of the isolations 15 is substantially greater than the thickness of the semiconductor layer 13. In some embodiments, the depth of the isolations 15 is substantially greater than a total thickness of the semiconductor layer 13 and the etch stop layer 12. In some embodiments, the isolations 15 penetrate the semiconductor layer 13 and the etch stop layer 12. In some embodiments, the isolations 15 extend through a portion of the semiconductor layer 11. The isolations 15 may be connected with each other, and the semiconductor layer 13 may be divided into multiple semiconductor islands (e.g., 131, 132 and 133). In some embodiments, the isolations 15 include silicon oxide, silicon nitride, silicon oxy-nitride, a low-k dielectric material, a high-k dielectric material, combinations thereof, and/or other suitable materials. In some embodiments, the isolations 15 are connected to each other.

Please refer to FIG. 6, which is a schematic cross-sectional diagram of a semiconductor structure at a stage of the operation 601 of the method 600 in accordance with some embodiments of the present disclosure. An interconnect structure 16 is formed over the top surface 134 of the semiconductor layer 13, and a substrate 10 is thereby formed. In some embodiments, a dielectric layer 161 covers a gate structure 142 of the transistor 14. In some embodiments, a material of the dielectric layer 161 is the same as that of the isolations 15. In some embodiments, the dielectric layer 161 includes oxide. Conductive vias 162, 164 and 166 and conductive lines 163 and 165 provide electrical connections to the S/D regions 141, the gate structure 142, and the semiconductor layer 13. In some embodiments, the conductive vias 162, 164 and 166 and the conductive lines 163 and 165 include metallic material. In some embodiments, the conductive vias 162, 164 and 166 and/or the conductive lines 163 and 165 include aluminum (Al), copper (Cu), tungsten (W), titanium (Ti), tantalum (Ta), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), titanium nitride (TiN), tungsten nitride (WN), tantalum nitride (TaN), ruthenium (Ru), titanium silicon nitride (TiSiN), or other suitable materials. In some embodiments, a material of the conductive vias 162, 164 and 166 is similar to or same as that of the conductive lines 163 and 165.

The conductive lines 165 define a topmost layer of the conductive lines of the interconnect structure 16. In some embodiments, the conductive lines 165 are exposed through the dielectric layer 161. In some embodiments, a top surface of the dielectric layer 161 and top surfaces of the conductive lines 165 together define a top surface 167 of the interconnect structure 16. In some embodiments, the conductive lines 165 are distributed evenly at the top surface 167 for a purpose of hybrid bonding to be performed at a later stage. In some embodiments, some of the conductive lines 165 are dummy structures, which are electrically isolated or physically separated from all other conductive elements (e.g., the conductive vias 164). The dummy structures of the conductive lines 165 are for a purpose of better planarization of a polishing operation optionally performed on the top surface 167.

Figure 17:
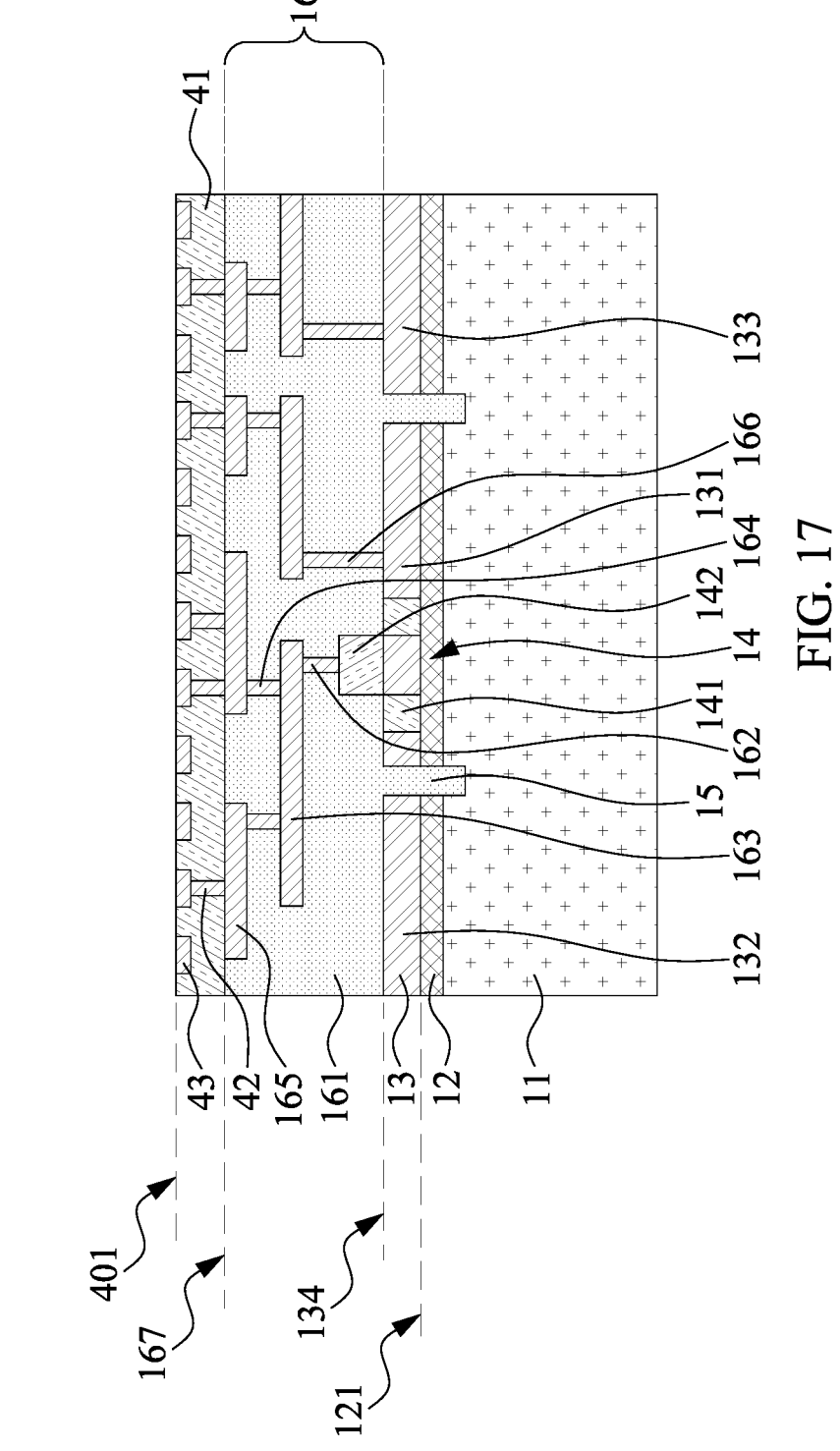
FIGS. 17 to 19 are schematic cross-sectional diagrams of a semiconductor structure at different stages of a manufacturing method in accordance with some embodiments of the disclosure.

In alternative embodiments as shown in FIG. 17, the semiconductor structure 10 further includes a passivation layer 41, hybrid-bond contacts 42 and a hybrid-bond layer. In some embodiments, the passivation layer 41 is formed over the interconnect structure 16. In some embodiments, the passivation layer 41 is a multi-layer structure. The hybrid-bond contacts 42 are formed within the passivation layer 41 and between the conductive lines 165 and the hybrid-bond layer. In some embodiments, the hybrid-bond contacts 42 are for a purpose of electrical connection between the interconnect structure 16 and the hybrid-bond layer. The hybrid-bond layer is disposed over the hybrid-bond contacts 42 and includes multiple hybrid-bond pads 43. The hybrid-bond pads 43 are surrounded by and exposed through the passivation layer 41. In some embodiments, a top surface of the passivation layer 41 and a top surface of the hybrid-bond layer (defined by top surfaces of the hybrid-bond pads 43) together define a bonding surface 401 of the substrate 10. In some embodiments, a planarization is performed on the passivation layer 41 and the hybrid-bond pads 43 prior to the hybrid bonding. In some embodiments, the hybrid-bond pads 43 are distributed evenly at the bonding surface 401 to provide a better planarization result and also to prevent dishing. As a result of the hybrid-bond pads 43, a distribution of the conductive lines 165 can be even (similar to the distribution of the conductive lines 165 shown in FIG. 6) or uneven (as shown in FIG. 17).

Figure 7:
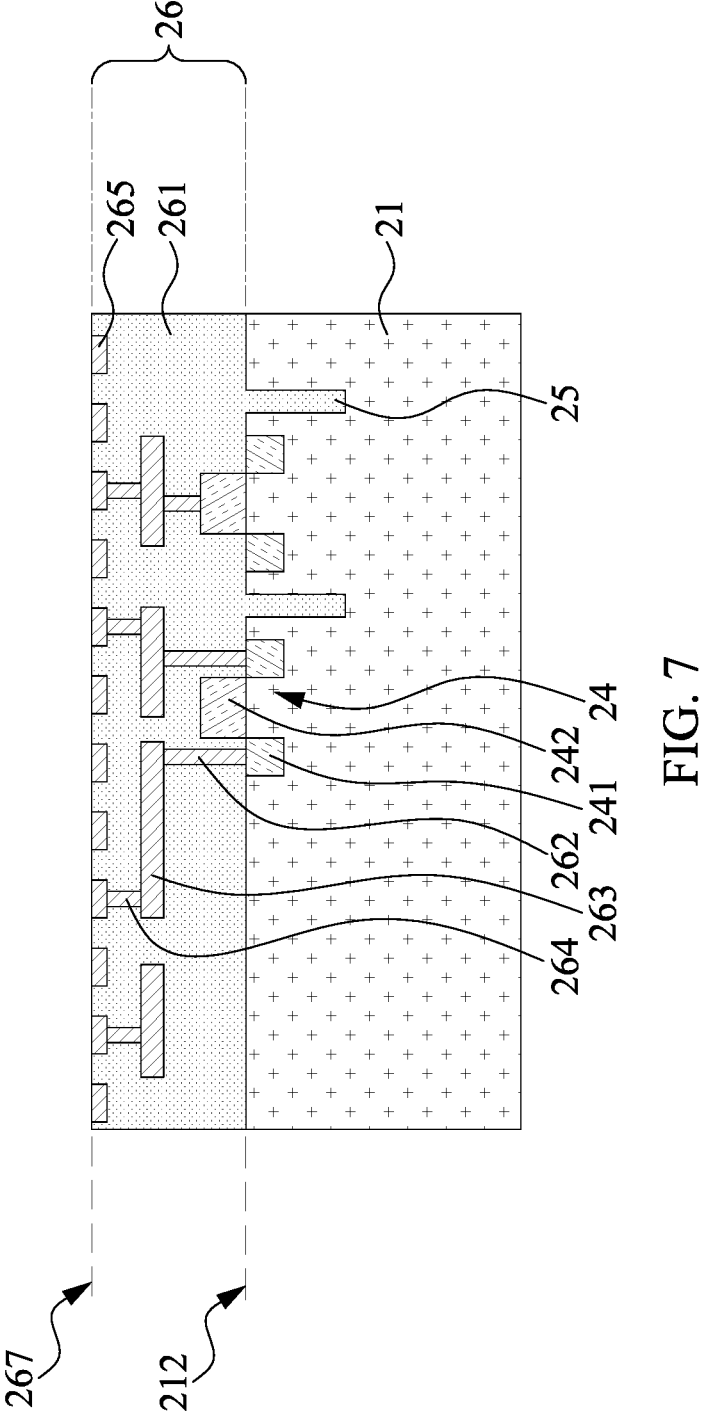

Please refer to FIG. 7, which is a schematic cross-sectional diagram of a semiconductor structure at a stage of the operation 601 of the method 600 in accordance with some embodiments of the present disclosure. A substrate 20 is formed, provided, or received. The substrate 20 may include a semiconductor layer 21, transistors 24 formed in the semiconductor layer 21, isolations 25 formed in the semiconductor layer 21 between the transistors 24, and an interconnect structure 26 formed over the semiconductor layer 21 and covering the transistors 24. In some embodiments, the isolations 25 extend through a portion of the semiconductor layer 21. In some embodiments, formation of the substrate 20 is similar to the formation of the substrate 10 but without formation of an etch stop layer and another semiconductor layer over the semiconductor layer 21. The transistor 24 includes S/D regions 241 and a gate structure 242 between the S/D regions 241. In some embodiments, a depth of the S/D regions 241 is less than a depth of the isolations 25 from a top surface 212 of the semiconductor layer 21. A dielectric layer 261 of the interconnect structure 26 covers the gate substrate 242 and the S/D regions 241 of the transistor 24. In some embodiments, a material of the dielectric layer 161 is the same as that of the isolations 15. In some embodiments, the dielectric layer 161 and the isolations 25 include oxide. Conductive vias 262 and 264 and conductive lines 263 and 265 provide electrical connections to the S/D regions 241 and the gate structure 242. In some embodiments, a material of the conductive vias 262 and 264 and/or the conductive lines 263 and 265 includes aluminum (Al), copper (Cu), tungsten (W), titanium (Ti), tantalum (Ta), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), titanium nitride (TiN), tungsten nitride (WN), tantalum nitride (TaN), ruthenium (Ru), titanium silicon nitride (TiSiN), other suitable materials, or a combination thereof. In some embodiments, the material of the conductive vias 262 and 264 is similar to or the same as that of the conductive lines 263 and 265.

The conductive lines 265 define a topmost layer of the conductive lines of the interconnect structure 26. In some embodiments, the conductive lines 265 are exposed through the dielectric layer 261. In some embodiments, a top surface of the dielectric layer 261 and top surfaces of the conductive lines 165 together define a top surface 267 of the interconnect structure 26. In some embodiments, the conductive lines 265 are distributed evenly at the top surface 267 for a purpose of hybrid bonding to be performed at a later stage. In some embodiments, some of the conductive lines 265 are dummy structures, which are electrically isolated or physically separated from other conductive elements (e.g., the conductive vias 264). The dummy structures of the conductive lines 265 are for a purpose of better planarization of a polishing operation optionally performed on the top surface 267.

Figure 18:
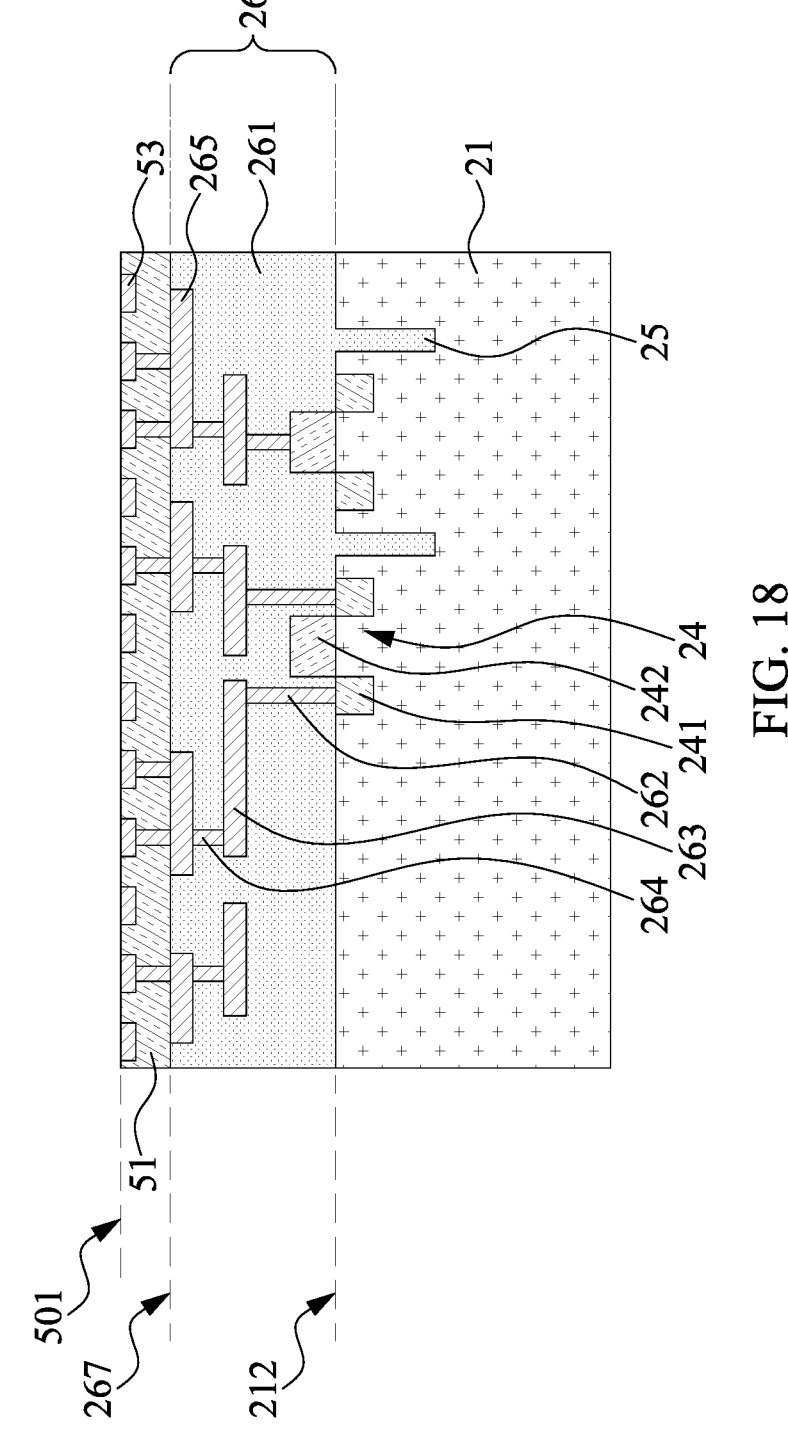
Figure 19:
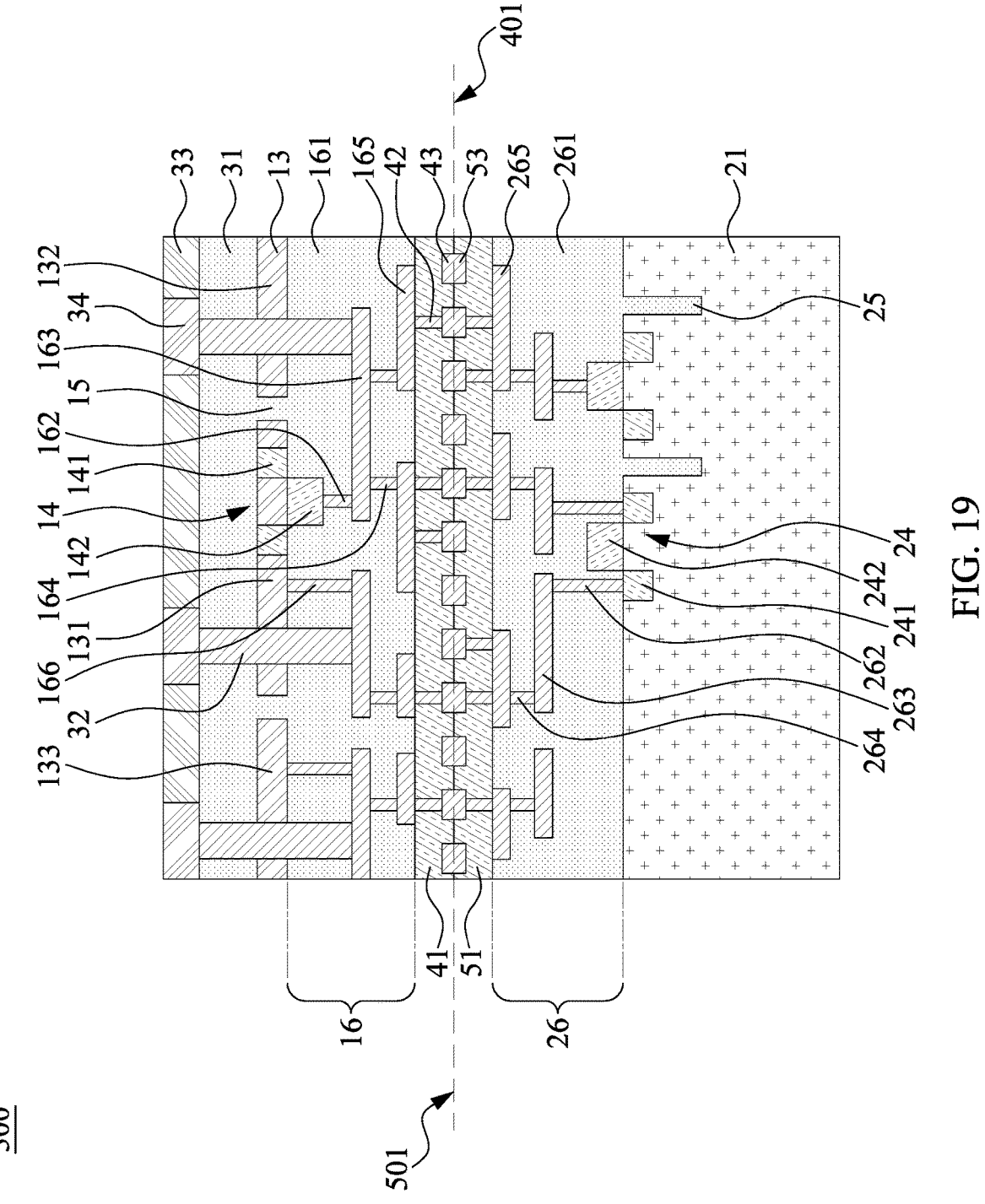

In alternative embodiments as shown in FIG. 18, the substrate 20 further includes a passivation layer 51, hybrid-bond contacts 52 and a hybrid-bond layer. In some embodiments, the passivation layer 51 is formed over the interconnect structure 26. In some embodiments, the passivation layer 51 is a multi-layer structure. The hybrid-bond contacts 52 are formed within the passivation layer 51 and between the conductive lines 265 and the hybrid-bond layer. In some embodiments, the hybrid-bond contacts 52 are for a purpose of electrical connection between the interconnect structure 26 and the hybrid-bond layer. The hybrid-bond layer is disposed over the hybrid-bond contacts 52 and includes multiple hybrid-bond pads 53. The hybrid-bond pads 53 are surrounded by and exposed through the passivation layer 51. In some embodiments, a top surface of the passivation layer 51 and a top surface of the hybrid-bond layer (defined by top surfaces of the hybrid-bond pads 53) together define a bonding surface 501 of the substrate 20. In some embodiments, a planarization is performed on the passivation layer 51 and the hybrid-bond pads 53 prior to the hybrid bonding. In some embodiments, the hybrid-bond pads 53 are distributed evenly at the bonding surface 501 to provide a better planarization result and also to prevent dishing. As a result of the hybrid-bond pads 43, the distribution of the conductive lines 165 can be even (similar to the distribution of the conductive lines 165 shown in FIG. 6) or uneven (as shown in FIG. 19).

Figure 8:
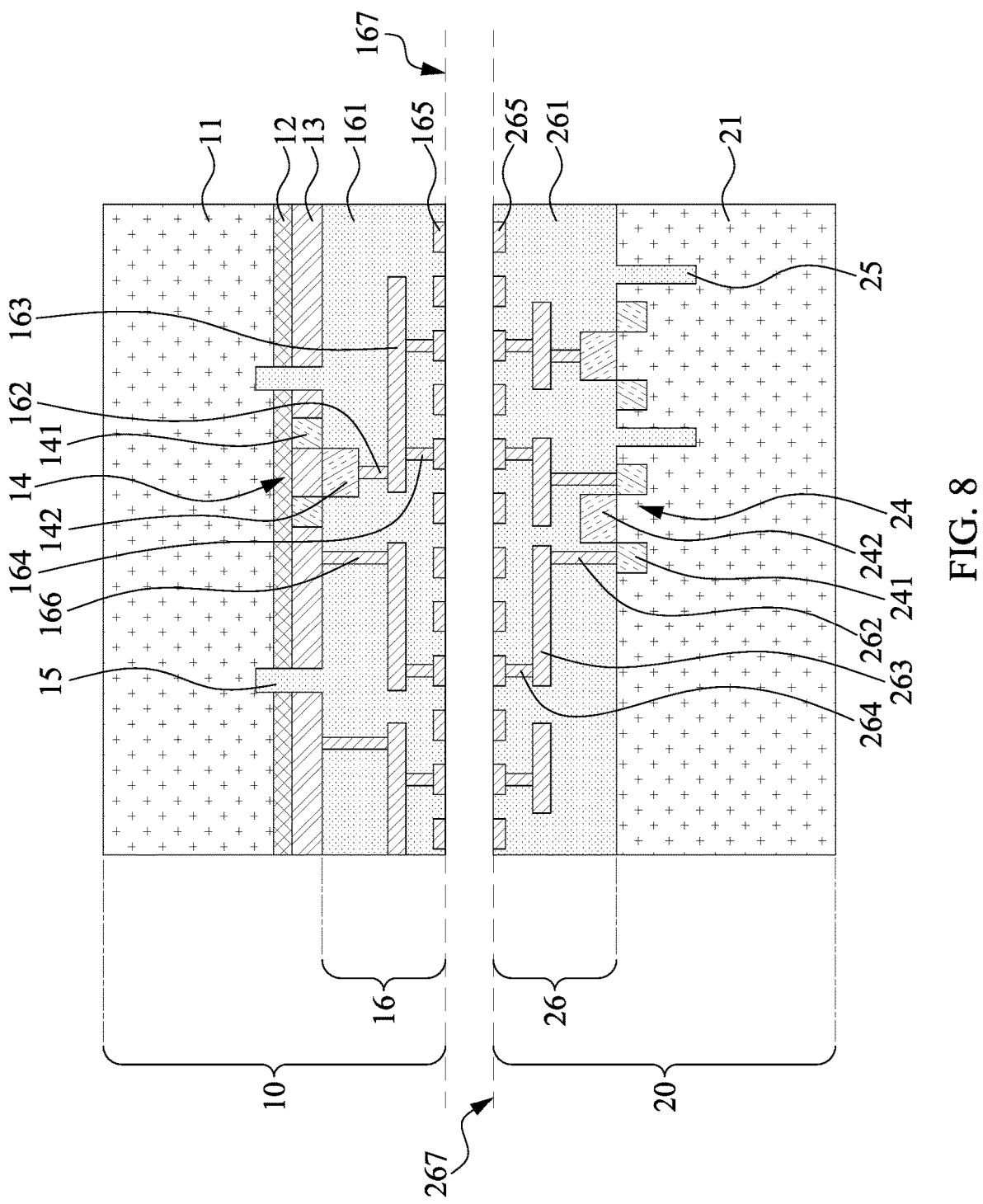
Figure 9:
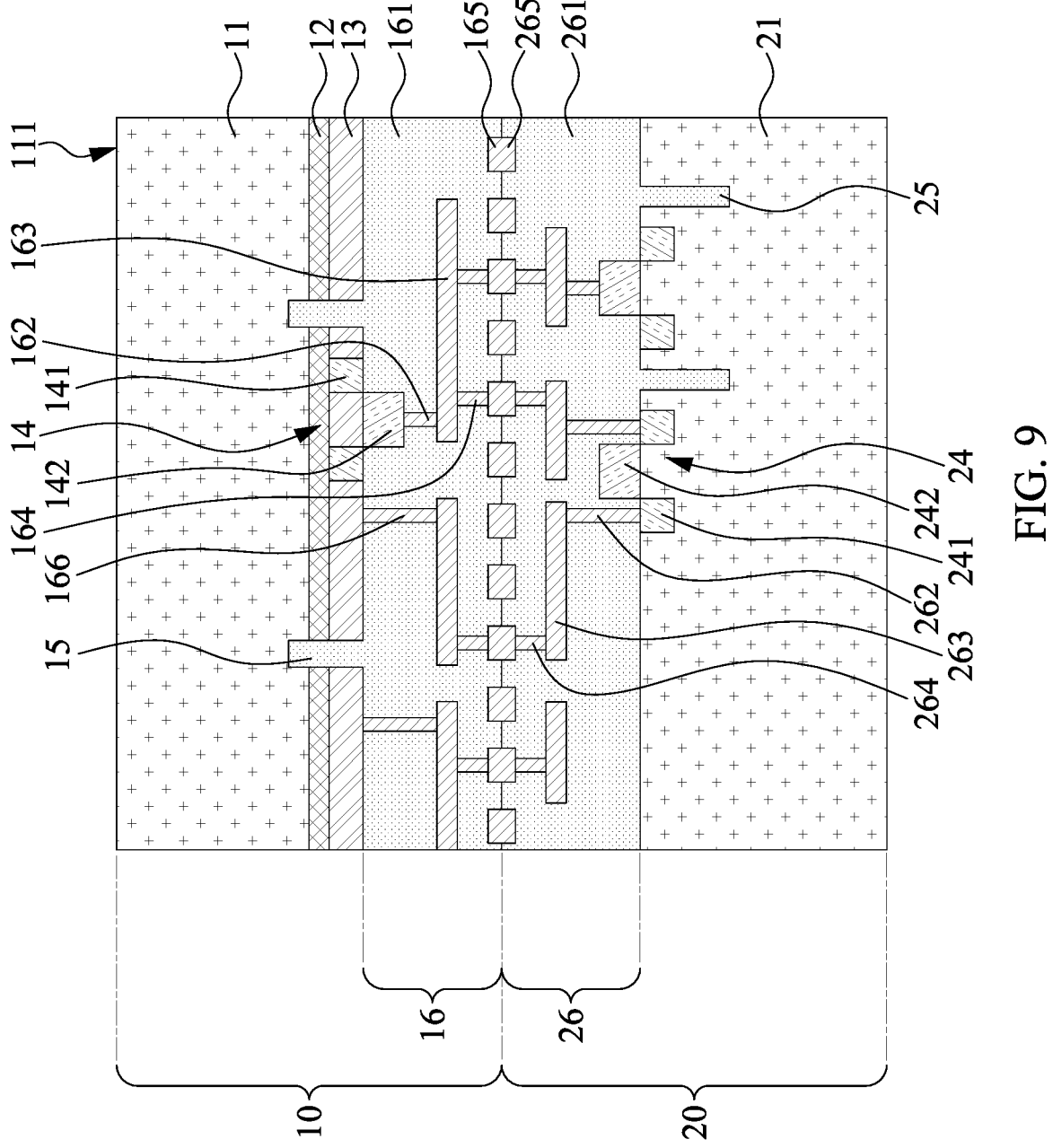

Please refer to FIGS. 8 to 9, which are schematic cross-sectional diagrams of a semiconductor structure at different stages of the method 600 in accordance with some embodiments of the present disclosure. In the operation 602, the interconnect structures 16 and 26 are bonded in a bonding operation. In some embodiments, the substrate 10 is flipped over and disposed over the substrate 20 as shown in FIG. 8. In some embodiments, the top surface 167 of the interconnect structure 16 faces toward the top surface 267 of the interconnect structure 26, and the conductive lines 165 are aligned with the conductive lines 265 prior to the bonding operation. Each of the top surfaces 167 and 267 includes dielectric materials and conductive materials, and thus a hybrid bonding operation is performed to bond the substrates 10 and 20. In some embodiments, the hybrid bonding operation includes an annealing operation. In some embodiments, the top surfaces 167 and 267 become a bonding interface of the substrates 10 and 20. A boundary or an interface of between the conductive lines 165 and 265 may or may not be observed by an electron microscope after the bonding operation as shown in FIG. 9.

Figure 10:
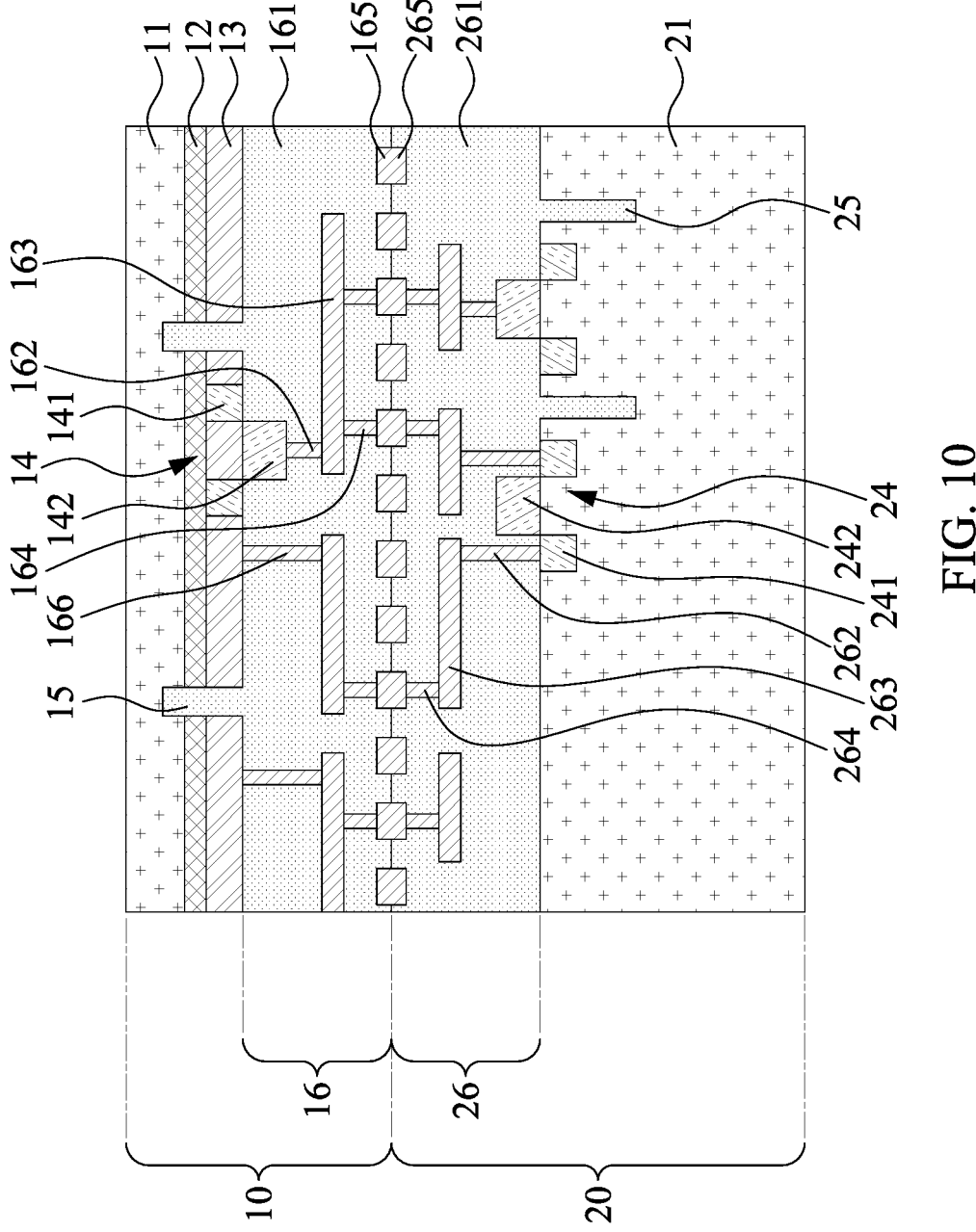

Please refer to FIG. 10, which is a schematic cross-sectional diagram of a semiconductor structure at a stage of the method 600 in accordance with some embodiments of the present disclosure. In the operation 603, a thickness of the substrate 10 is reduced. In some embodiments, a portion of the semiconductor layer 11 is removed. In some embodiments, the removal of the portion of the semiconductor layer 11 includes a chemical mechanical polish (CMP), a dry etching operation, a wet etching operation, a directional plasma etching operation, or a combination thereof. In some embodiments, the CMP is performed on a surface 111 of the semiconductor layer 11 opposite to the etch stop layer 12. In some embodiments, the CMP is performed for a certain duration of time and stops above the isolations 15.

Figure 11:
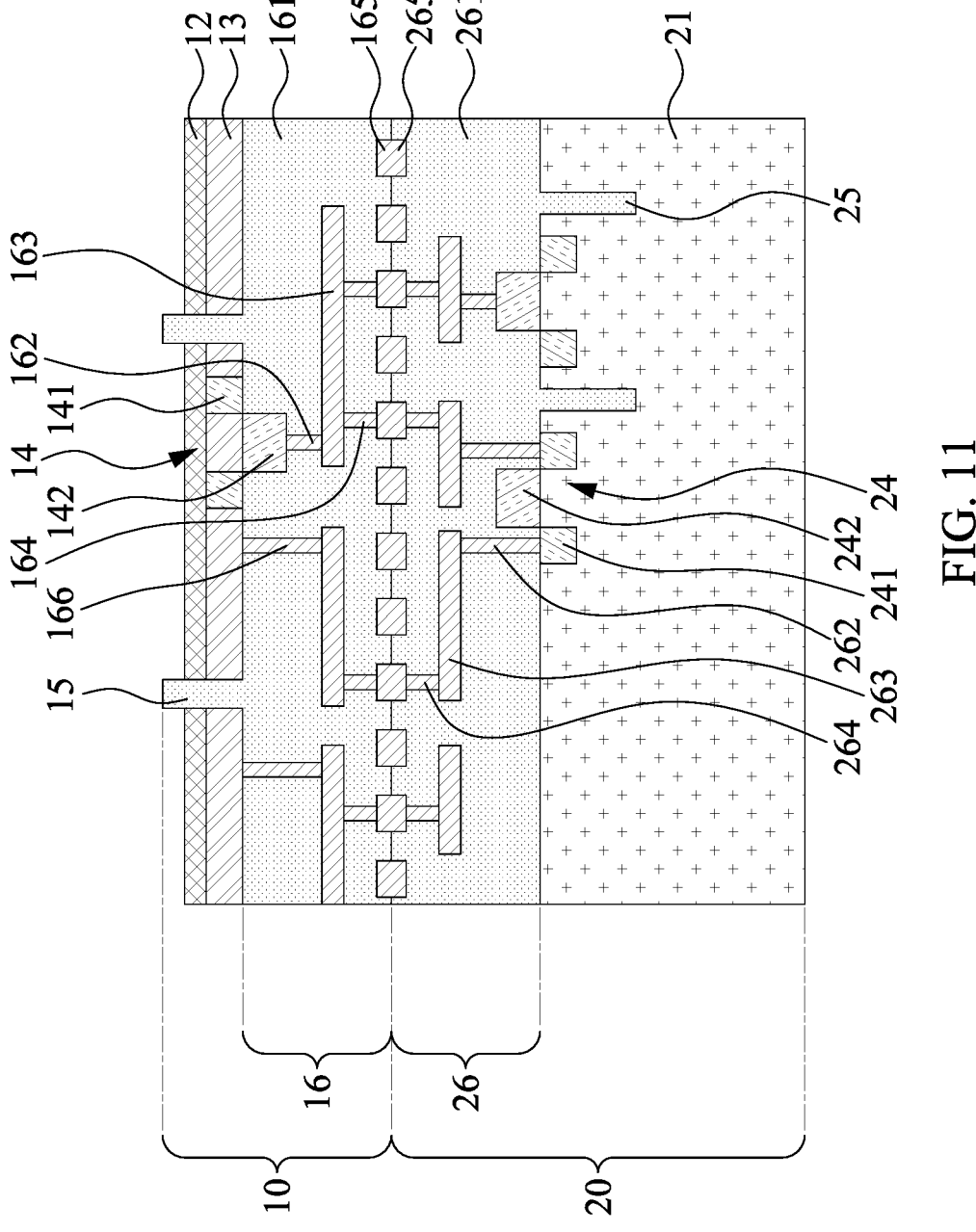

Please refer to FIG. 11, which is a schematic cross-sectional diagram of a semiconductor structure at a stage of the method 600 in accordance with some embodiments of the present disclosure. After the operation 603, a sequence of operations may be performed to expose the S/D regions of the transistor 14. In some embodiments, a wet etching operation is performed to remove a remaining portion of the semiconductor layer 21. In some embodiments, the wet etching operation is performed until the etch stop layer 12 is reached. In some embodiments, an etchant of the wet etching operation includes tetramethyl ammonium hydroxide (TMAH), ammonium hydroxide (NH$_4$OH), other suitable chemicals, or a combination thereof. In some embodiments, the wet etching operation removes only the semiconductor layer 21 and the isolations 15 remain intact.

In some embodiments, after the wet etching operation, the isolations 15 protrude from the etch stop layer 12.

Figure 12:
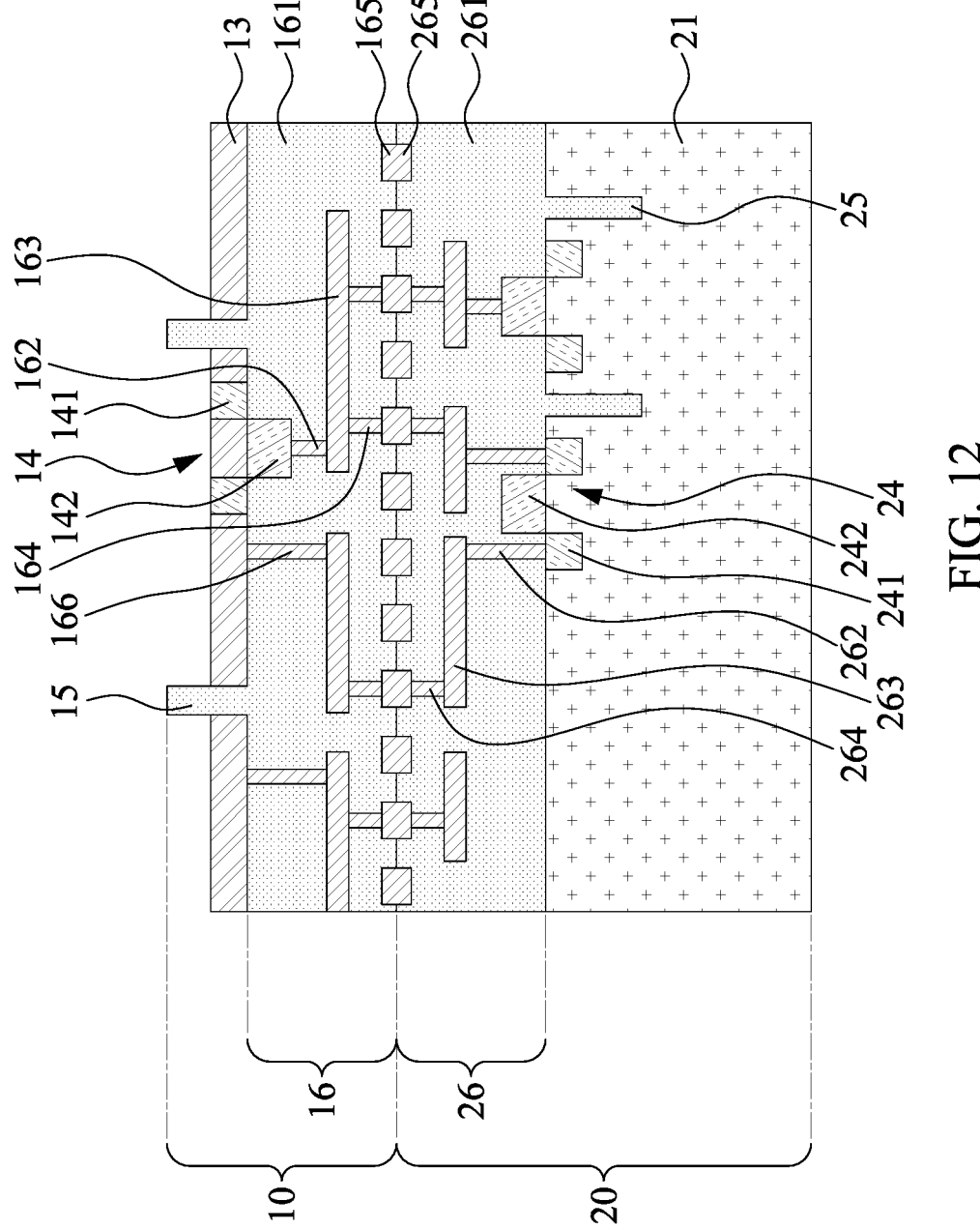

Please refer to FIG. 12, which is a schematic cross-sectional diagram of a semiconductor structure at a stage of the method 600 in accordance with some embodiments of the present disclosure. After the wet etching operation, the etch stop layer 12 is removed. The etch stop layer 12 may be removed by a wet etching operation, a selective dry etching operation, other suitable etching operations, or a combination thereof. An etchant used in the wet etching operation to remove the etch stop layer 12 may not be able to remove the isolations 15. In some embodiments, the isolations 15 remain after the removal of the etch stop layer 12. A surficial portion of the semiconductor layer 13 exposed after the removal of the etch stop layer 12 may be damaged. In some embodiments, another wet etching operation may be optionally performed to remove a damaged portion of the semiconductor layer 13. In some embodiments, a thickness of the semiconductor layer 13 is reduced by 50 to 150 Å by the wet etching operation.

Figure 13:
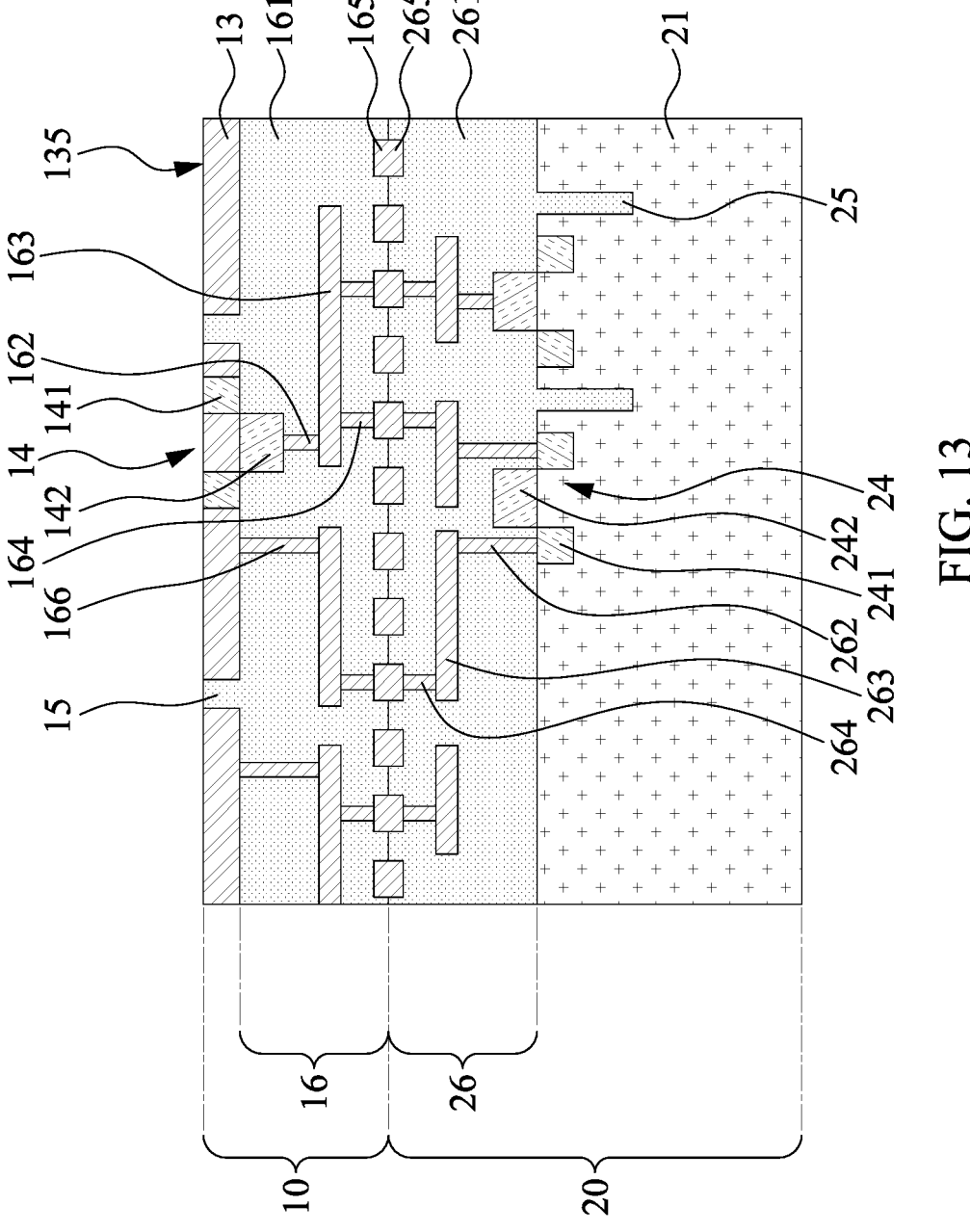

Please refer to FIG. 13, which is a schematic cross-sectional diagram of a semiconductor structure at a stage of the method 600 in accordance with some embodiments of the present disclosure. After the exposure of the semiconductor layer 13, a planarization is performed to remove a portion of the isolations 15 above the semiconductor layer 13. In some embodiments, the planarization includes a CMP, a wet etching operation, a dry etching operation, or a combination thereof. The removal of the portion of the isolations 15 can be performed prior to, concurrent with, or after the removal of the damaged portion of the semiconductor layer 13. In some embodiments, the removal of the portion of the isolations 15 and the removal of the damaged portion of the semiconductor layer 13 are performed by a same wet etching operation. A planar surface 135 is thereby provided. In other words, a height of the isolations 15 at this stage is substantially equal to a thickness of the semiconductor layer 13. In some embodiments, the height of the isolations 15 is in a range of 100 to 5000 μm.

Figure 14:
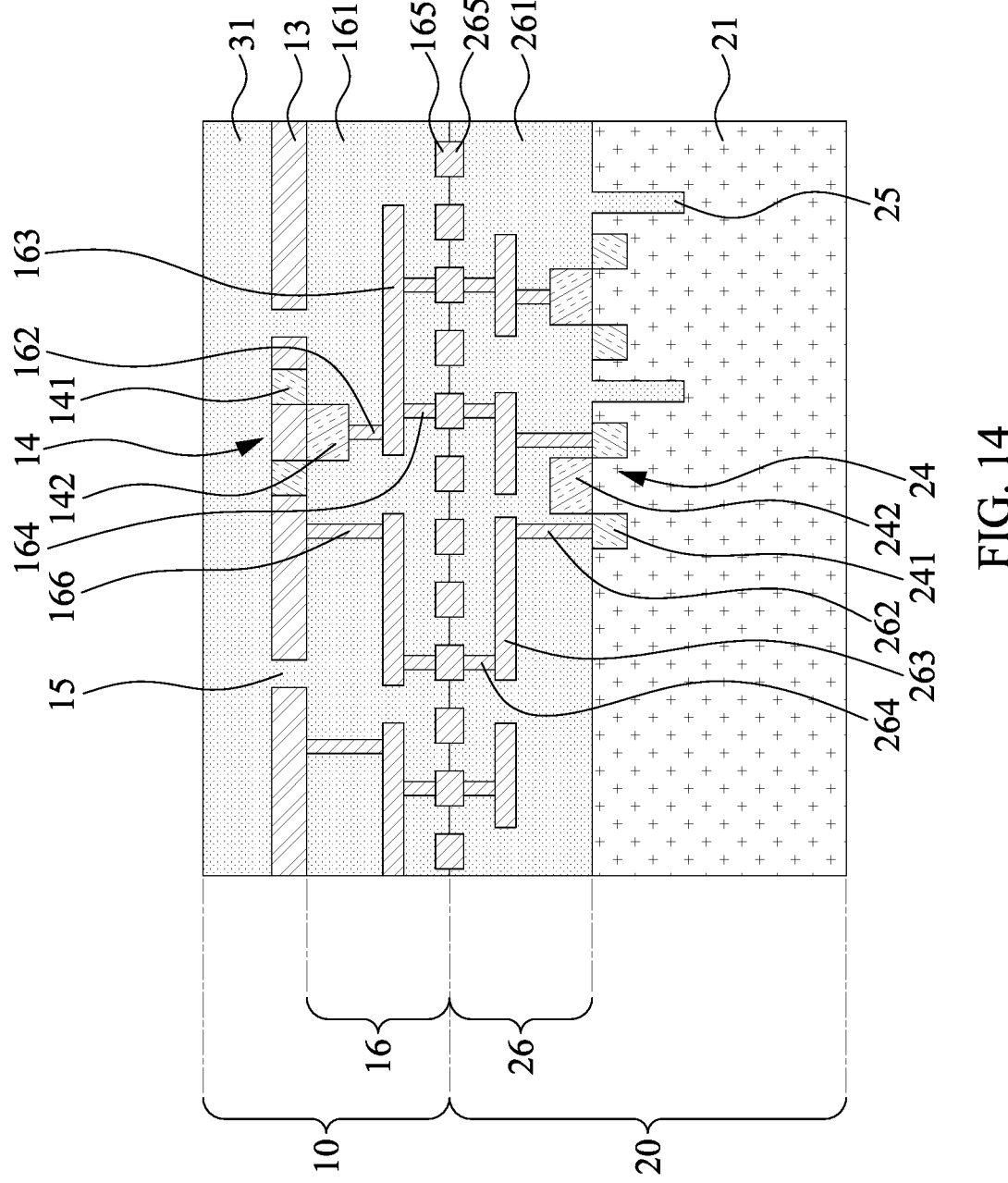

Please refer to FIG. 14, which is a schematic cross-sectional diagram of a semiconductor structure at a stage of the method 600 in accordance with some embodiments of the present disclosure. In the operation 604, a dielectric layer 31 is formed over the planar surface 135 and the semiconductor layer 13. In some embodiments, the dielectric layer 31 includes material that is similar to or same as that of the isolations 15. A boundary or an interface between the isolations 15 and the dielectric layer 31 may or may not be observed by an electron microscope depending on materials of the isolations 15 and the dielectric layer 31. In some embodiments, the dielectric layer 31 is formed by a deposition. In some embodiments, a CMP is optionally performed on the dielectric layer 31 to provide a planar surface of the dielectric layer 31. In some embodiments, a thickness of the dielectric layer 31 is in a range of 1000 to 20000 Å. In some embodiments, the dielectric layer 31 is considered as a portion of the substrate 10, and therefore the substrate 10 becomes a SOI structure as shown in FIG. 14.

Figure 15:
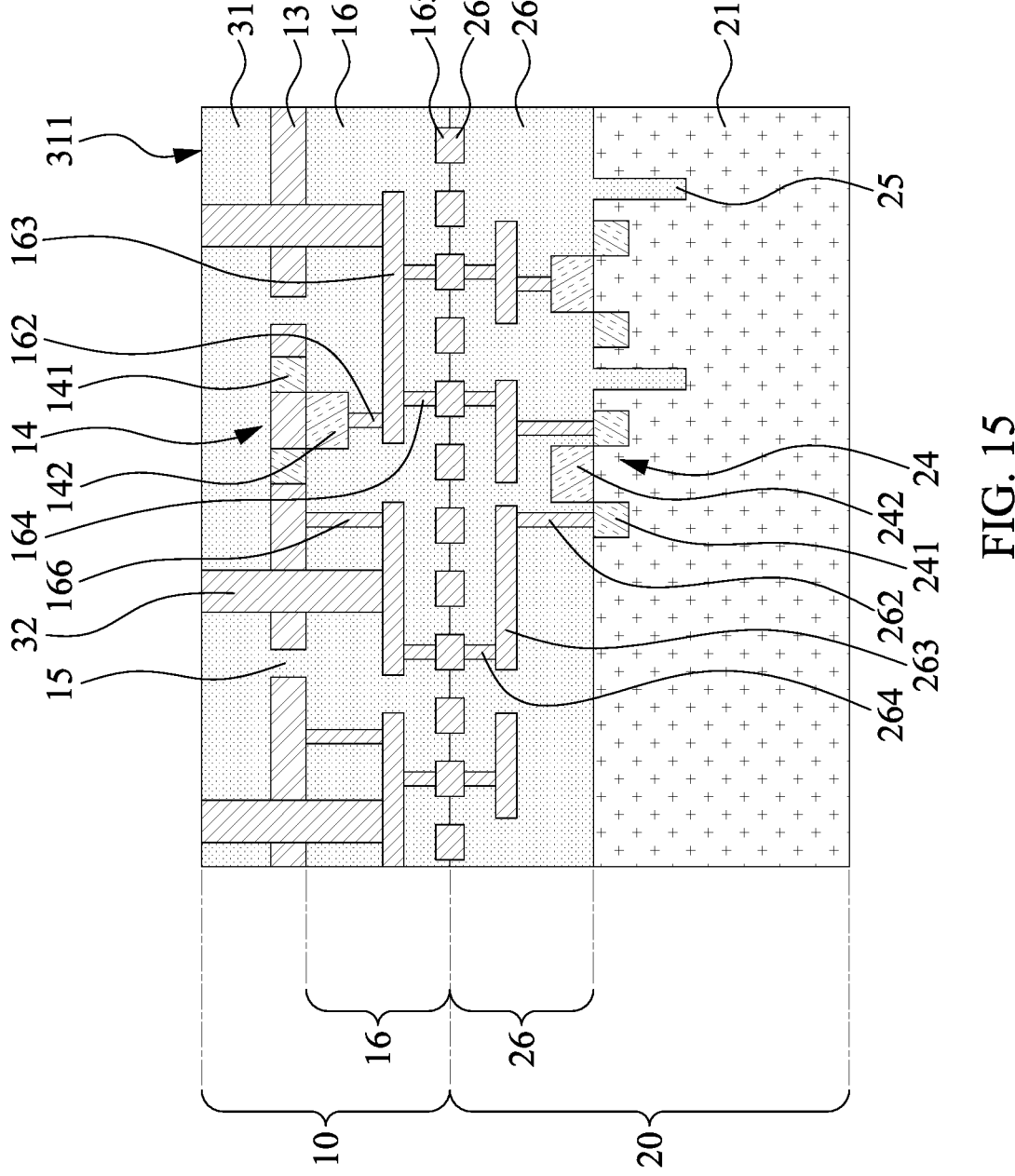

Please refer to FIG. 15, which is a schematic cross-sectional diagram of a semiconductor structure at a stage of the method 600 in accordance with some embodiments of the present disclosure. In the operation 605, conductive vias 32 are formed to electrically connect to at least one of the semiconductor layer 13, the interconnect structure 16, the interconnect structure 26, the electrical components 14, the electrical components 24, and the semiconductor layer 21. In some embodiments, all of the semiconductor islands 131,

132 and 133 of the semiconductor layer 13 are electrically connected to the conductive vias 32. The conductive via 32 may extend from a surface 311 of the dielectric layer 31 into the interconnect structure 16. In some embodiments, the conductive via 32 penetrates the dielectric layer 31 and the semiconductor layer 13. The conductive via 32 can electrically connect to all of the semiconductor layer 13, the interconnect structure 26, the electrical components 14, the electrical components 24, and the semiconductor layer 21, individually or collectively, by the interconnect structure 16. A dimension of the conductive via 32 may be greater than a dimension of the conductive via 262 and a dimension of the conductive via 264. In some embodiments, a length of the conductive via 32 is greater than that of the conductive via 262 or 264. In some embodiments, a width of the conductive via 32 is greater than that of the conductive via 262 or 264.

Figure 16:
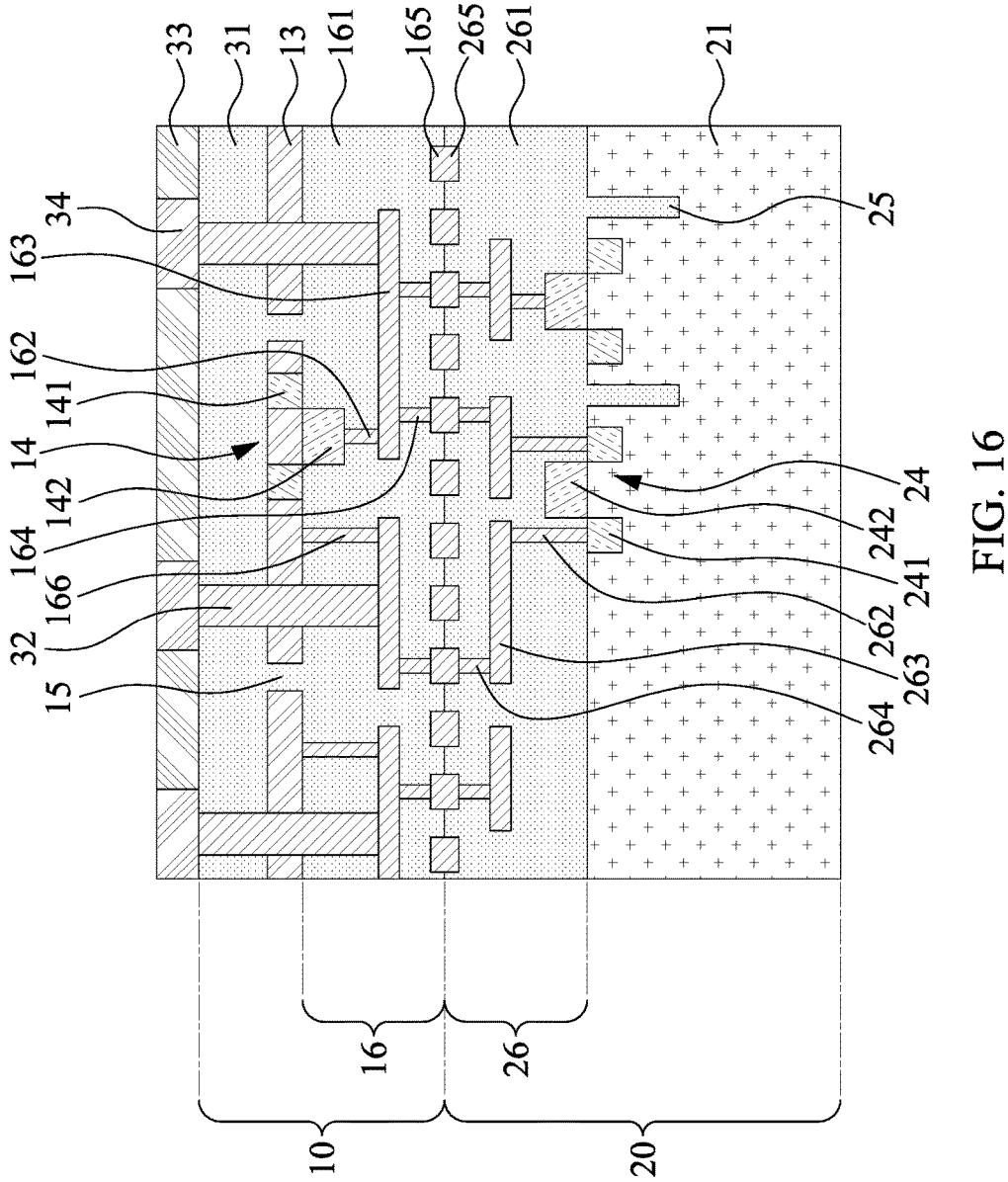

Please refer to FIG. 16, which is a schematic cross-sectional diagram of a semiconductor structure at a stage of the method 600 in accordance with some embodiments of the present disclosure. After the operation 605, the method 600 may further include formation of a passivation layer 33 and conductive pads 34. The conductive pads 34 may be formed over and electrically connect to the conductive vias 32. In some embodiments, the conductive pads 34 are in physical contact with the conductive vias 32. The passivation layer 33 may be disposed on the surface 311 of the dielectric layer 31 and surrounds the conductive pads 34. The conductive pads 34 are electrically isolated and physically separated from one another by the passivation layer 33. In some embodiments, the conductive pads 34 include aluminum (Al), copper (Cu), tungsten (W), other suitable materials, or a combination thereof. A semiconductor structure 200 is thereby formed.

Please refer to FIG. 19, which is a schematic cross-sectional diagram of a semiconductor structure at a stage of the method 600 in accordance with some embodiments of the present disclosure. The operations as depicted in FIGS. 8 to 16 are performed on the substrates 10 and 20 shown in FIGS. 17 and 18, and a semiconductor structure 300 is thereby formed. In some embodiments, the hybrid-bond pads 43 face toward and are aligned with the hybrid-bond pads 53, and a bonding operation is performed. In some embodiments, the bonding surface 401 of the substrate 10 contacts the bonding surface 501 of the substrate 20. In some embodiments, the bonding surface 401 or the bonding surface 501 becomes a bonding interface between the substrate 10 and the substrate 20. An interface between the hybrid-bond pads 43 and 53 may or may not be observed by an electron microscope. Similarly, an interface between the passivation layers 41 and 51 may or may not be observed by an electron microscope depending on materials of the passivation layers 41 and 51 and operation parameters.

The above description is for a purpose of illustration of the concept of the present disclosure, and the present disclosure is not limited to the embodiments as described above. The method 600 illustrated above provides a SOI structure formed from a bulk substrate, and thus, a cost of the manufacturing process can be reduced. The substrate 10 can be formed by a low-temperature process (e.g. all operations of the process is controlled under 800 degree Celsius), and thus the method 600 can be applied in advanced manufacturing process. In addition, as a more advanced semiconductor (e.g. GAAFET), a higher quality of a silicon (or another elementary semiconductor) substrate is required. It is experimented that a high quality of silicon layer (which can be the semiconductor layer 13) can be formed over a silicon germanium (which can be the etch stop layer 12), and thus different generations of devices or electrical components can be applied in the substrate 10, such as a traditional planar transistor as shown in the figures or a GAAFET as illustrated in the paragraphs above. However, the present disclosure can also be applied on a SOI wafer (that is, no formation of the etch stop layer 12 and the semiconductor layer 13, and the operations depicted in FIGS. 5 to 15 are applied on a SOI substrate 10) to form a semiconductor structure similar to the semiconductor structure 100, 200 or 300 as depicted in the figures.

Therefore, the present disclosure provides a method including a backside etching operation to form a SOI substrate from a bulk substrate. The present disclosure can realize a RF device on a SOI substrate to keep good analog performance and a digital device on a bulk substrate to prevent floating body effect if the RF device is formed on a substrate same as the digital device, while a product size can be reduced by about 30% to about 50% compared to a conventional structure. Other advantages and benefits of the semiconductor structure according to the present disclosure as illustrated in the above specification can also be provided.

In accordance with some embodiments of the disclosure, a semiconductor structure is provided. The semiconductor structure includes a first substrate and a second substrate. The first substrate includes: a first semiconductor layer, including a first trench isolation that extends through a portion of the first substrate layer; and a first interconnect structure, disposed over the first semiconductor layer. The second substrate includes: a second semiconductor layer, including a plurality of semiconductor islands and surrounded by at least a second isolation penetrating the second semiconductor layer; a second interconnect structure, disposed over the second substrate layer and bonded to the first interconnect structure; and a dielectric layer, disposed over the second semiconductor layer opposite to the second interconnect structure.

In accordance with some embodiments of the disclosure, a semiconductor structure is provided. The semiconductor structure includes a first semiconductor layer, a first interconnect structure, a second interconnect structure, a second semiconductor layer, an oxide layer and a through via structure. The first interconnect structure is disposed over the first semiconductor layer. The second interconnect structure is disposed over the first interconnect structure. The second semiconductor layer is disposed over the second interconnect structure. The oxide layer is disposed over the second semiconductor layer and includes a first surface opposite to the second substrate layer. The through via structure extends from the first surface of the oxide layer and extends through a portion of the second interconnect structure.

In accordance with some embodiments of the disclosure, a method for manufacturing a semiconductor structure is provided. The method may include several operations. A first dielectric layer is formed over a substrate. A first substrate and a second substrate are provided or received. A first interconnect structure of the first substrate is bonded to a second interconnect structure of the second substrate. A thickness of the first substrate is reduced. A dielectric layer is formed over the first semiconductor layer. A conductive via extending from a surface of the dielectric layer and electrically connected to the first semiconductor layer is formed.

The foregoing outlines features of several embodiments so that those skilled in the art may better understand aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor structure, comprising:

providing a first semiconductor substrate and a second semiconductor substrate;

bonding a first interconnect structure of the first semiconductor substrate to a second interconnect structure of the second semiconductor substrate;

reducing a thickness of the first semiconductor substrate, wherein the thickness of the first semiconductor substrate is reduced to a range of 100 angstroms to 5,000 angstroms;

forming a dielectric layer over the first semiconductor substrate; and forming a conductive via, extending from a surface of the dielectric layer and electrically connected to the first semiconductor substrate, wherein the conductive via has an exposed surface aligned with the surface of the dielectric layer.

2. The method of claim 1, wherein the providing of the first semiconductor substrate includes:

receiving a bulk substrate;

forming an etch stop layer over the bulk substrate;

growing a silicon layer over the etch stop layer, wherein the first semiconductor substrate includes the bulk substrate, the etch stop layer and the silicon layer;

forming a transistor in the silicon layer; and forming the first interconnect structure over the silicon layer and the transistor.

3. The method of claim 2, wherein the etch stop layer includes silicon germanium.

4. The method of claim 2, wherein the reduction of the thickness of the first semiconductor substrate includes:

performing a polishing operation on the bulk substrate from a side of the bulk substrate opposite to the etch stop layer;

performing an etching operation on the bulk substrate until an exposure of the etch stop layer occurs; and removing the etch stop layer.

5. The method of claim 4, wherein the reduction of the thickness of the first semiconductor substrate further includes:

reducing a thickness of the silicon layer after the removal of the etch stop layer.

6. The method of claim 1, further comprising:

exposing an isolation structure in the first semiconductor substrate during the reduction of the thickness of the first semiconductor substrate; and removing an exposed portion of the isolation structure after the reduction of the thickness of the first semiconductor substrate.

7. A method of manufacturing a semiconductor structure, comprising:

receiving a first substrate having a first front surface and a first back surface opposite to the first front surface;

forming an etch stop layer and a semiconductor layer over the first front surface of the first substrate;

forming an electrical component and an isolation over the first front surface of the first substrate;

forming a first interconnect structure over the first front surface of the first substrate;

receiving a second substrate having a second front surface and a second back surface opposite to the second front surface, wherein a second interconnect structure is formed over the second front surface of the second substrate;

bonding the first interconnect structure to the second interconnect structure;

removing a portion of the first substrate from the first back surface of the first substrate;

removing the etch stop layer to expose the semiconductor layer, wherein the semiconductor layer and the isolation form a planar surface; and forming a dielectric layer over the first back surface of the first substrate.

8. The method of claim 7, wherein a portion of the electrical component is formed in the semiconductor layer.

9. The method of claim 7, wherein the isolation is formed in the semiconductor layer, the etch stop layer and the first substrate.

10. The method of claim 7, wherein a portion of the isolation is exposed after the removing of the portion of the first substrate.

11. The method of claim 7, wherein the removing of the portion of the first substrate further comprises:

performing a first removal to remove a first portion of the first substrate from the first back surface, wherein the etch stop layer and the isolation are covered by the first substrate after the first removal; and performing a second removal to remove a second portion of the first substrate from the first back surface to expose the etch stop layer and the isolation.

12. The method of claim 7, wherein the dielectric layer is coupled to the isolation.

13. The method of claim 7, further comprising forming a conductive via extending from a surface of the dielectric layer and electrically connected to the first semiconductor substrate, wherein the conductive via has an exposed surface aligned with the surface of the dielectric layer.

14. A method of manufacturing a semiconductor structure, comprising:

receiving a first substrate comprising an electrical component and an isolation formed on a front side of the first substrate;

bonding the first substrate to a second substrate with the electrical component and the isolation facing the second substrate;

reducing a thickness of the first substrate from a back side of the first substrate;

removing a portion of the first substrate from the back side of the first substrate to expose the isolation;

removing a portion of the isolation exposed through the back side of the first substrate;

forming a dielectric layer on the back side of the first substrate, wherein the dielectric layer is coupled to the isolation;

forming a conductive via over the first substrate on the back side; and forming a conductive pad over the first substrate on the back side, wherein a bottom surface of the conductive pad is aligned with a top surface of the dielectric layer.

15. The method of claim 14, further comprising forming a first interconnect structure over the first substrate on the front side.

16. The method of claim 15, wherein the conductive via penetrates the dielectric layer, and is coupled to the first interconnect structure.

17. The method of claim 15, wherein the second substrate comprises a second interconnect structure formed over the second substrate on the front side of the second substrate.

18. The method of claim 17, wherein the first interconnect structure is bonded to the second interconnect structure.

19. The method of claim 14, further comprising forming a passivation layer over the first substrate on the back side, wherein the conductive pad is formed in the passivation layer.

20. The method of claim 14, wherein a planar surface is formed on the back side of the first substrate after the removing of the exposed portion of the isolation.

* * * * *